United States Patent
Otsuka et al.

(10) Patent No.: US 8,028,584 B2
(45) Date of Patent: Oct. 4, 2011

(54) PRESSURE SENSOR AND METHOD FOR MANUFACTURING THE SAME

(75) Inventors: Kiyoshi Otsuka, Kariya (JP); Yasuaki Makino, Okazaki (JP); Tsuyoshi Fukada, Aichi-gun (JP); Inao Toyoda, Anjo (JP); Naoki Kakoiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 693 days.

(21) Appl. No.: 12/219,785

(22) Filed: Jul. 29, 2008

(65) Prior Publication Data

US 2009/0049921 A1    Feb. 26, 2009

(30) Foreign Application Priority Data

Aug. 20, 2007   (JP) .................................. 2007-213487
Mar. 13, 2008   (JP) .................................. 2008-063869

(51) Int. Cl.
    *G01L 7/00*   (2006.01)
(52) U.S. Cl. ................ 73/706; 73/723; 73/756
(58) Field of Classification Search ............ 73/706, 73/715, 723, 753, 756
    See application file for complete search history.

(56) References Cited

U.S. PATENT DOCUMENTS

| | | | |
|---|---|---|---|
| 5,900,554 A * | 5/1999 | Baba et al. ........................ 73/725 |
| 6,050,146 A * | 4/2000 | Nakamura et al. ............... 73/725 |
| 6,591,689 B2 | 7/2003 | Nidan et al. |
| 6,694,818 B2 * | 2/2004 | Chikuan et al. ................. 73/715 |
| 6,700,208 B1 | 3/2004 | Yoneda |
| 6,883,219 B2 * | 4/2005 | Kuroda et al. ............. 29/407.07 |
| 7,210,357 B2 | 5/2007 | Tanaka et al. |
| 7,225,679 B2 * | 6/2007 | Miyagawa et al. ............. 73/753 |
| 7,231,830 B2 * | 6/2007 | Otsuka et al. ................... 73/756 |
| 7,243,561 B2 | 7/2007 | Ishigami et al. |
| 7,404,330 B2 * | 7/2008 | Uchigashima et al. ......... 73/717 |
| 7,412,894 B2 * | 8/2008 | Ueyanagi et al. ............... 73/753 |
| 7,530,275 B2 * | 5/2009 | Wiedemann et al. ........... 73/715 |
| 7,536,916 B2 * | 5/2009 | Matsui et al. ................... 73/753 |
| 7,628,078 B2 * | 12/2009 | Matsui et al. ................... 73/715 |

(Continued)

FOREIGN PATENT DOCUMENTS

JP         A-62-081775        4/1987

(Continued)

OTHER PUBLICATIONS

Notice of Reason for Refusal mailed on Jan. 26, 2010 from Japan Patent Office in the corresponding Japanese patent application No. 2008-063869 (and English translation).

(Continued)

*Primary Examiner* — Freddie Kirkland, III
(74) *Attorney, Agent, or Firm* — Posz Law Group, PLC

(57) ABSTRACT

A pressure sensor includes: a housing having a pressure introduction port; and a connector case integrated with the housing. The connector case includes: a protruding portion that protrudes in the pressure introduction port along with the introduction direction from one end of the connector case, and has a concavity hollowed in a direction perpendicular to the introduction direction; a sensor chip having a pressure gauge on one surface of the chip in the concavity; a terminal having one end inserted and molded in the connector case; and a bonding wire that electrically connects the sensor chip and the one end of the terminal. The connector case seals a connection portion between the bonding wire and the terminal, a connection portion between the boding wire and the sensor chip, and the bonding wire.

42 Claims, 20 Drawing Sheets

U.S. PATENT DOCUMENTS

| | | |
|---|---|---|
| 2002/0005072 A1 | 1/2002 | Nidan et al. |
| 2005/0194685 A1 | 9/2005 | Weiblen et al. |
| 2005/0199068 A1* | 9/2005 | Yoshino .......................... 73/715 |
| 2006/0053908 A1 | 3/2006 | Ishigami et al. |
| 2007/0022808 A1 | 2/2007 | Tanaka et al. |
| 2008/0148860 A1* | 6/2008 | Murakami et al. ............... 73/726 |
| 2009/0095059 A1* | 4/2009 | Matsui et al. .............. 73/114.18 |

FOREIGN PATENT DOCUMENTS

| | | |
|---|---|---|
| JP | A-05-001962 | 1/1993 |
| JP | A-05-118945 | 5/1993 |
| JP | A-2002-098607 | 4/2002 |
| JP | A-2002-168715 | 6/2002 |
| JP | A-2003-315194 | 11/2003 |
| JP | A-2004-294295 | 10/2004 |
| JP | A-2006-023110 | 1/2006 |
| JP | A-2006-208088 | 8/2006 |
| JP | A-2007-040749 | 2/2007 |

OTHER PUBLICATIONS

Notice of Reason for Refusal issued from the Japanese Patent Office on Aug. 18, 2009 in the corresponding Japanese patent application No. 2007-213487 (and English translation).

* cited by examiner

PRESSURE SENSOR AND METHOD FOR MANUFACTURING THE SAME

CROSS REFERENCE TO RELATED APPLICATIONS

This application is based on Japanese Patent Applications No. 2007-213487 filed on Aug. 20, 2007, and No. 2008-63869 filed on Mar. 13, 2008, the disclosures of which are incorporated herein by reference.

FIELD OF THE INVENTION

The present disclosure relates to a pressure sensor and a method for manufacturing a pressure sensor.

BACKGROUND OF THE INVENTION

A pressure sensor in which even if a pressure medium is brought into direct contact with the pressure receiving plane of a pressure detection element or with a bonding wire connected to the pressure receiving plane, the pressure detection element is protected and an electric leak is prevented is proposed in the related art, for example, in a patent document 1.

Specifically, the patent document 1 proposes the pressure sensor including: a housing into which a pressure medium is introduced; a case mounted in the housing; a sensor chip as a pressure detection element which is mounted in the case and has a pressure receiving plane on which pressure from the pressure medium is received; a terminal mounted around the sensor chip of the case; and a bonding wire whose one end is electrically connected to the pressure receiving plane of the sensor chip and whose other end is electrically connected to the terminal.

In this pressure sensor, a middle portion between the one end and the other end of the boding wire is coated with a first coating material having electric insulation and resistance to the pressure medium. Moreover, the connection portion of the bonding wire and the sensor chip, the connection portion of the bonding wire and the terminal, and the pressure receiving plane of the sensor chip are coated with a second coating material having electric insulation and resistance to the pressure medium.

The sensor chip is mounted in the case in such a way that the pressure receiving plane is vertical to the direction in which the pressure medium is introduced. The bonding wire is extended in a direction vertical to the direction, in which the pressure medium is introduced, from the pressure receiving plane of the sensor chip and is connected to a terminal arranged on the same plane as the pressure receiving plane. Moreover, the housing and the case are sealed from each other via an O ring of a sealing part arranged so as to surround the sensor chip, the bonding wire, and the terminal.

The above-mentioned pressure sensor is constructed in such a way that the pressure medium is directly introduced to the pressure receiving plane of the sensor chip, but the bonding wire and the pressure receiving plane of the sensor chip are coated with the coating material. Hence, the sensor chip can be protected and an electric leak can be prevented.

[Patent Document] JP-2006-208088A

However, in the related art, the pressure receiving plane of the sensor chip is arranged vertically to the direction in which the pressure medium is introduced and hence the bonding wire needs to be extended on the same plane as the pressure receiving plane from the pressure receiving plane of the sensor chip, which results in enlarging the outside diameter of the case. In this case, the outside diameter needs to be increased in consideration of the arrangement of the O ring surrounding the terminal and the like. In this manner, the related art presents a problem that the outside diameter of the pressure sensor results in being enlarged.

Moreover, the first coating material with which the bonding wire is coated performs the function of protecting the boding wire from the pressure medium but the pressure of the pressure medium is directly applied to the bonding wire. That is, there is presented a problem that the bonding wire is broken by the pulsation of the pressure medium, which results in interrupting the electric connection of the sensor chip and the terminal.

Thus, it is required to reduce the size of a pressure sensor and to prevent the electric connection of a sensor chip and a terminal from being interrupted.

Further, a pressure sensor having its size reduced is proposed in the related art, for example, in a patent document 2. Specifically, the patent document 2 proposes a structure in which a resin case has a wiring board mounted on its one end portion and in which a sensor chip formed of a semiconductor substrate is flip-chip bonded to the one plane of the wiring board via bumps.

The wiring board is electrically connected to terminals inserted and molded in the case and is mounted on the case with the plane of the board directed in parallel to the radial direction of the pressure sensor. Moreover, a gage part for detecting pressure is formed in the central portion of a square pressure receiving plane of the sensor chip and the bumps are disposed on four corners of the pressure receiving plane. The sensor chip is flip-chip bonded to the wiring board via the bumps, whereby the sensor chip, the wiring board, the terminals are electrically connected to each other. With this, the sensor chip is disposed in parallel to the wiring board and hence the pressure receiving plane of the sensor chip is directed in parallel to the radial direction of the pressure sensor.

In this manner, the electric connection portions of the sensor chip are connected not by wire bonding but by flip-chip bonding requiring a smaller area, so that the size of the pressure sensor can be reduced.

[Patent Document 2] JP-2006-177925A Corresponding to U.S. Pat. No. 7,210,357

However, the related art described above presents the following problem: that is, when the pressure sensor receives ambient temperature and the temperature of a pressure medium, because the case made of resin, the bump made of metal, and the sensor chip made of semiconductor are different from each other in the coefficient of linear expansion, a thermal stress is caused by the expansion of the case made of resin having the largest coefficient of linear expansion and is transmitted to the sensor chip made of semiconductor having the smallest coefficient of linear expansion via the wiring board and the bumps.

As described above, since the bumps are disposed on the four corners of the pressure receiving plane, the thermal stress is directly transmitted to the gage part via paths in four directions. In other words, the gage part is distorted by the thermal stress in four directions. Thus, pressure including pressure produced by the distortion caused by the thermal stress is detected in the gage part. This reduces the accuracy of detecting the pressure.

Thus, it is required to provide a pressure sensor that can make it harder for thermal stress to be transmitted to a gage part and a method for manufacturing the pressure sensor.

SUMMARY OF THE INVENTION

In view of the above-described problem, it is an object of the present disclosure to provide a pressure sensor. It is another object of the present disclosure to provide a method for manufacturing a pressure sensor.

According to a first aspect of the present disclosure, a pressure sensor includes: a housing having a pressure introduction port; and a connector case integrated with the housing. The pressure introduction port has a first opening for introducing a pressure medium into the pressure introducing port along with an introduction direction so that the pressure medium reaches the connector case. The connector case includes: a protruding portion that protrudes in the pressure introduction port along with the introduction direction from one end of the connector case, and has a concavity hollowed in a direction perpendicular to the introduction direction; a sensor chip that has a gauge for detecting pressure disposed on one surface of the chip, and is disposed in the concavity so that the one surface of the chip is parallel to the introduction direction; a terminal having one end, which is inserted and molded in the connector case so that the one end is sealed by the connector case; and a bonding wire that electrically connects the sensor chip and the one end of the terminal. The connector case seals a connection portion between the bonding wire and the terminal, a connection portion between the boding wire and the sensor chip, and the bonding wire.

According to this, the width of the sensor chip in a direction vertical to the introduction direction of the pressure medium can be reduced by the arrangement of the sensor chip. With this, the size in a radial direction of the pressure sensor can be reduced and by extension the size of the pressure sensor can be reduced.

Moreover, since the bonding wire is sealed by the connector case, it is possible to prevent the pressure of the pressure medium from being applied directly to the bonding wire. Thus, it is possible to avoid the bonding wire from being broken by the pulsation of the pressure medium and hence to prevent the electric connection of the sensor chip and the terminal from being interrupted.

As described above, it is possible to reduce the size of the pressure sensor and to prevent the electric connection of the sensor chip and the terminal from being interrupted.

According to a second aspect of the present disclosure, a pressure sensor includes: a housing having a pressure introduction port; and a connector case integrated with the housing. The pressure introduction port has a first opening for introducing a pressure medium into the pressure introducing port along with an introduction direction so that the pressure medium reaches the connector case. The connector case includes: a sensor chip that has a gauge for detecting pressure disposed on one surface of the sensor chip, and is disposed in parallel to the introduction direction, the one surface being exposed from one end of the connector case; a terminal having one end, which is inserted and molded in the connector case so that the one end is sealed by the connector case; and a bonding wire that electrically connects the sensor chip and the one end of the terminal. The connector case seals a connection portion between the bonding wire and the terminal, a connection portion between the boding wire and the sensor chip, and the bonding wire.

With this, the width of the sensor chip in a direction vertical to the introduction direction of the pressure medium can be reduced and hence the size of the pressure sensor can be reduced. Further, since the bonding wire can be sealed in the connector case, it is possible to avoid the bonding wire from being broken and hence to prevent the electric connection of the sensor chip and the terminal from being interrupted.

According to a third aspect of the present disclosure, a pressure sensor includes: a housing having a pressure introduction port; and a connector case integrated with the housing. The pressure introduction port has a first opening for introducing a pressure medium into the pressure introducing port along with an introduction direction so that the pressure medium reaches the connector case. The connector case includes: a protruding portion that protrudes in the pressure introduction port along with the introduction direction from one end of the connector case, and has a concavity hollowed in a direction perpendicular to the introduction direction; a sensor chip that has a gauge for detecting pressure disposed on one surface of the chip, and is disposed in the concavity so that the one surface of the chip is parallel to the introduction direction; and a terminal having one end, which is inserted and molded in the connector case and electrically connected to the sensor chip directly without using a bonding wire.

With this, the width of the sensor chip in a direction vertical to the introduction direction of the pressure medium can be reduced and hence the size of the pressure sensor can be reduced. Further, since the bonding wire is not used, it is possible to prevent the electric connection of the sensor chip and the terminal from being interrupted.

According to a fourth aspect of the present disclosure, a pressure sensor includes: a housing having a pressure introduction port; and a connector case integrated with the housing. The pressure introduction port has a first opening for introducing a pressure medium into the pressure introducing port along with an introduction direction so that the pressure medium reaches the connector case. The connector case includes: a protruding portion that protrudes in the pressure introduction port along with the introduction direction from one end of the connector case; a first chip that has a gauge for detecting pressure disposed on one surface of the chip, and is disposed on one surface of the protruding portion, which is parallel to the introduction direction; a second chip having a circuit for processing a signal output from the first chip, and inserted and molded in the connector case in such a manner that the second chip is parallel to the introduction direction; an internal connection terminal having a bar shape and having one end and the other end, the one end electrically connected to the first chip, and the other end connected to the second chip via a first bonding wire; and an external connection terminal having a bar shape and having one end connected to the second chip via a second bonding wire. The connector case seals the internal connection terminal, a connection portion between the internal connection terminal and the first bonding wire, the first bonding wire, a connection portion between the first boding wire and the second chip, and the second chip, a connection portion between the second chip and the second bonding wire, the second bonding wire, a connection portion between the second bonding wire and the external connection terminal.

Even in the case of using the first chip having a gage part formed thereon and the second chip having a circuit part formed thereon, it is possible to reduce the width in the introduction direction of the pressure medium in the respective chips by the arrangement of the respective chips and hence to reduce the size of the pressure sensor. Moreover, since the respective bonding wires are sealed by the connector case, it is possible to prevent the electric connection of the sensor chip and the terminal from being interrupted by a break in the respective bonding wires.

According to a fifth aspect of the present disclosure, a pressure sensor includes: a housing having a pressure introduction port; and a case having one end integrated in the housing. The pressure introduction port has an opening for introducing a pressure medium into the pressure introducing port along with an introduction direction so that the pressure medium reaches the one end of the case. The case includes: a groove disposed on the one end of the case, and hollowed in the introduction direction; a terminal inserted and molded in the case, and has one end exposed in the groove; and a sensor chip having one surface parallel to the introduction direction, and including a gage for detecting pressure. The gauge is disposed on the one surface of the sensor chip around one end of the sensor chip. The one end of the sensor chip is disposed on an opening side. The sensor chip further includes the other end, which is opposite to the one end, and disposed on a groove side. The other end of the sensor chip is electrically coupled with the one end of the terminal.

In the above sensor, thermal stress transmitted to the sensor chip from the terminal is transmitted only to a portion, which is close to the bottom side of the groove portion, of the one plane of the sensor chip. Moreover, the gate part is located at a portion, which is close to the opening side of the housing, of the one plane of the sensor chip, so that if the thermal stress does not cross the sensor chip in one direction from the bottom side of the groove portion to the opening side, the thermal stress does not reach the gage part. Thus, it is possible to make it harder for the thermal stress to be transmitted to the gage part and hence to reduce the effect of the thermal stress exerted on the gage part. With this, it is possible to increase the accuracy of detecting pressure.

According to a sixth aspect of the present disclosure, a method for manufacturing a pressure sensor, wherein the pressure sensor includes: a housing having a pressure introduction port; and a case having one end integrated in the housing, wherein the pressure introduction port has an opening for introducing a pressure medium into the pressure introducing port along with an introduction direction so that the pressure medium reaches the one end of the case, wherein the case includes: a groove disposed on the one end of the case, and hollowed in the introduction direction; a terminal inserted and molded in the case, and has one end exposed in the groove; and a sensor chip having one surface parallel to the introduction direction, and including a gage for detecting pressure, wherein the gauge is disposed on the one surface of the sensor chip around one end of the sensor chip, wherein the one end of the sensor chip is disposed on an opening side, wherein the sensor chip further includes the other end, which is opposite to the one end, and disposed on a groove side, and wherein the other end of the sensor chip is electrically coupled with the one end of the terminal, the method includes: preparing the case in which the terminal is inserted and molded; inserting the sensor chip into the groove by holding the other surface of the sensor chip opposite to the one surface of the sensor chip with a jig and by displacing the sensor chip relatively to the case; and electrically coupling the sensor chip to the terminal after inserting the sensor chip into the groove.

With this, the sensor chip can be arranged in the groove portion of the case with the one plane of the sensor chip set in parallel to the introduction direction of the pressure medium.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE PREFERRED EMBODIMENTS

First Embodiment

The present disclosure relates to a pressure sensor in which the pressure receiving plane of a sensor chip is arranged in parallel to the direction in which a pressure medium is introduced.

Hereinafter, a first embodiment of the present disclosure will be described with reference to the drawings. A pressure sensor shown in this embodiment is mounted in, for example, an automobile and is used as a pressure sensor for detecting the pressure of fuel, the pressure of oil for lubricating an engine and a drive system, the pressure of refrigerant of an air conditioner, and the pressure of exhaust gas.

Figure 1:
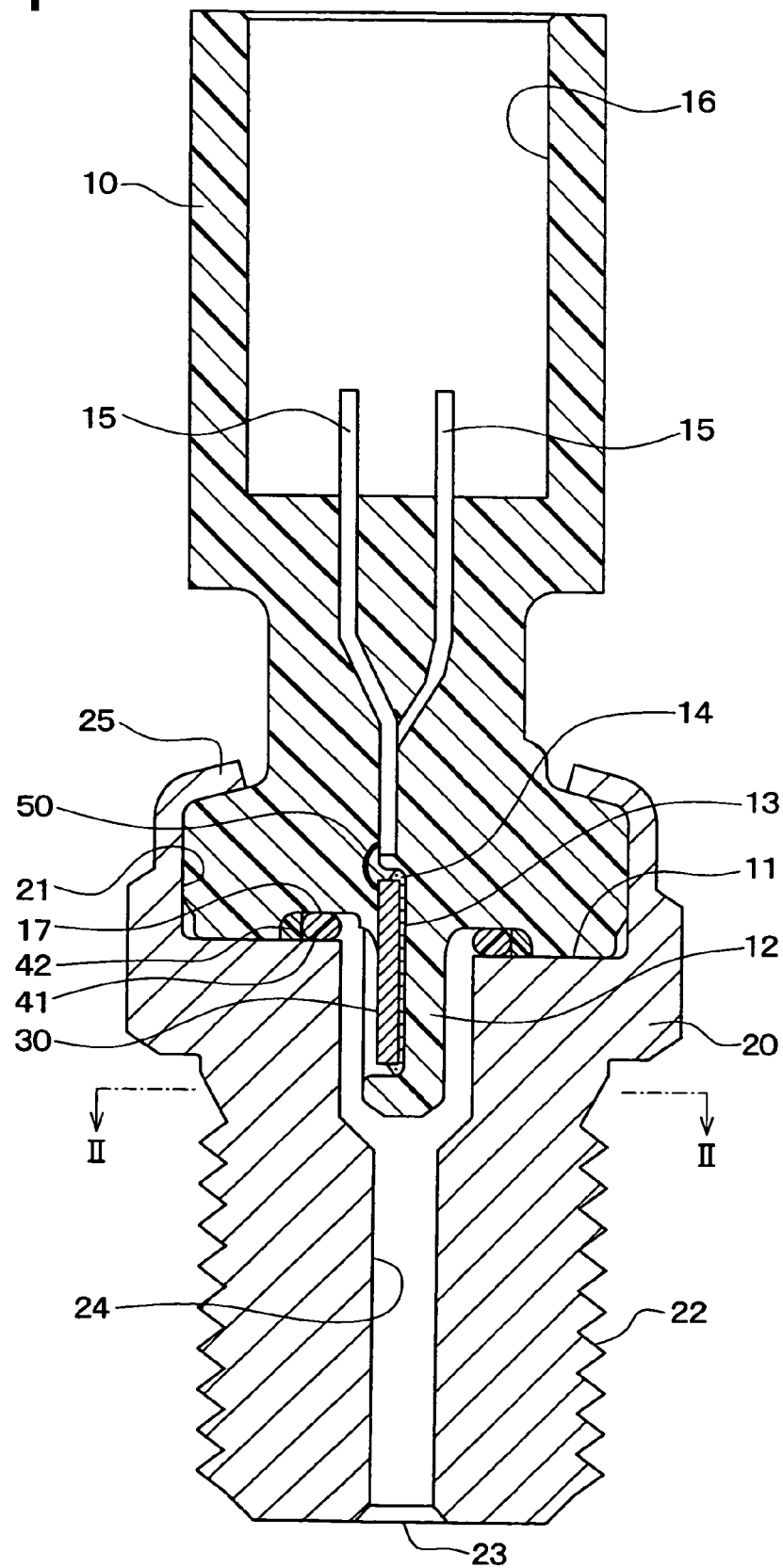
FIG. 1 is a schematic sectional view of a pressure sensor according to a first embodiment of the present disclosure.
Figure 2:
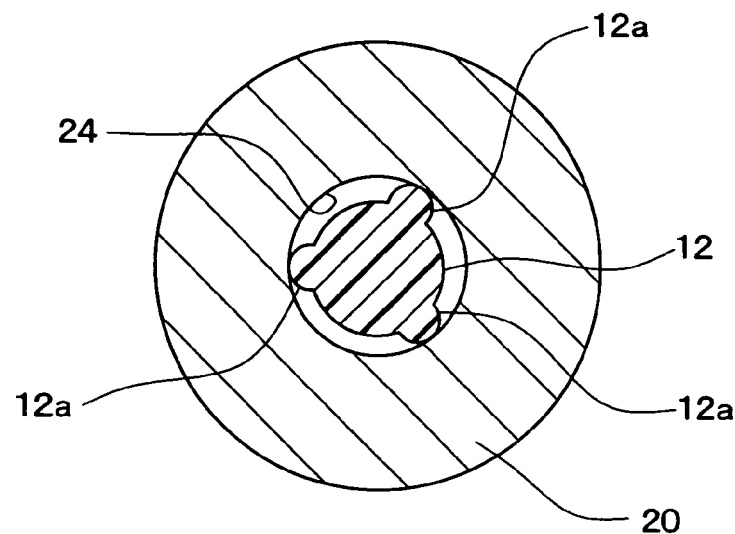
FIG. 2 is a sectional view taken on a line II-II in FIG. 1.
Figure 3:
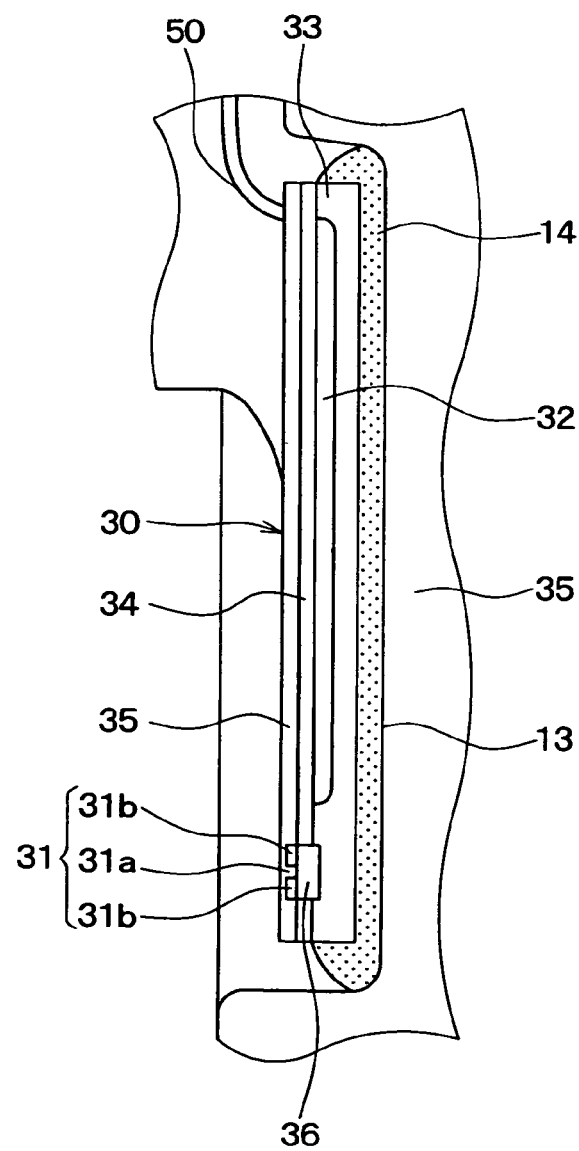
FIG. 3 is an enlarged sectional view of a portion near a sensor chip shown in FIG. 1.

FIG. 1 is a schematic sectional view of a pressure sensor according to the first embodiment of the present disclosure. FIG. 2 is a sectional view taken on a line II-II in FIG. 1. Moreover, FIG. 3 is an enlarged view of a portion near a sensor chip 30 shown in FIG. 1. The construction of the pressure sensor will be described with reference to these drawings.

The pressure sensor is constructed of a connector case 10, a housing 20, and the sensor chip 30.

The connector case 10 is a connector for outputting a signal showing the value of pressure detected by the pressure sensor and is molded by molding resin such as PPS (poly-phenylene sulfide) and PBT (poly-butylene terephthalate) by the use of a mold. In this embodiment, the connector case 10 is molded, for example, in the shape of a circular column.

On a tip plane 11 on the end portion of this connector case 10, there is formed a protruding portion 12 protruding in the axial direction of the connector case 10 from the tip surface 11. This protruding portion 12 has a depressed portion 13 formed, the depressed portion 13 being depressed in a direction vertical to the axial direction of the connector case 10 (in the direction in which a pressure medium to be described later is introduced). A sensor chip 30 is fixed to the depressed portion 13 via an adhesive 14. A portion of the sensor chip 30 is brought into the state where the portion is covered with the connector case 10.

Moreover, plural terminals 15, each of which is constructed of a bar-shaped part made of metal, are inserted and molded in the connector case 10. One end portions of the respective terminals 15 are brought into the state where they are inserted and molded in the connector case 10 and where they are not exposed from the connector case 10 but are sealed.

The other end portions of the respective terminals 15 are arranged so as to be exposed in an opening 16 formed in the other end portion of the connector case 10. That is, the other end portion in which the opening 15 is formed in the connector case 10 is constructed as a connector portion in the pressure sensor along with the other end portions of the respective terminals 15 located in the opening 16. In other words, an external connector (not shown) is connected to the opening 16 and is electrically connected to an ECU or the like of the automobile via a wiring part. An electrically conductive material such as copper is employed as the material of the terminals 15 like this.

Although not shown in the drawings, the connector case 10 is constructed of a primary molded part for holding the respective terminals 15 and the sensor chip 30 and a secondary molded part for forming the outer shape of the connector case 10.

The connector case 10 having the above-mentioned construction has a cylindrical housing 20 fitted thereon. Specifically, a receiving and depressed portion 21 is formed in the housing 20 and the one end portion of the connector case 10 is inserted into the receiving depressed portion 21, whereby the connector case 10 is fitted in the housing 20.

This housing 20 is a case that is formed of metal in a hollow shape by cutting or cold forging. The housing 20 has a threaded portion 22 formed on the outer peripheral surface of its one end portion, the threaded portion 22 being to be screwed in a body to be measured such as fuel piping. Moreover, the housing 20 has a pressure introduction port 24 formed in its one end portion, the pressure introduction port 24 being extended from an opening 23 formed in the one end portion of the housing 20 to the other end portion of the housing 20. This pressure introduction port 24 acts as a pressure introduction passage. In the housing 20 like this, a pressure medium is introduced from one end side of the housing 20 to the other end side thereof through the pressure introduction port 24.

Hereinafter, the direction in which the pressure medium flows through the pressure introduction passage from the opening 23 on the one end portion of the housing 20 to the other end side thereof is referred to as the introduction direction of the pressure medium.

Moreover, the protruding portion 12 of the connector case 10 is inserted into the pressure introduction port 24 opening to the other end of the housing 20. In this embodiment, as shown in FIG. 1, the diameter on the other end side of the housing 20 of the pressure introduction port 24 is made larger than the diameter on the opening 23 side so as to prevent the protruding portion 12 and the wall surface of the pressure introduction port 24 from being brought into contact with each other.

As shown in FIG. 2, plural protruding portions 12a protruding in a direction vertical to the central axis of the connector case 10, that is, in a direction vertical to the introduction direction of the pressure medium are formed on the side surface of the protruding portion 12, and the respective protruding portions 12a are in contact with the wall surface of the pressure introduction port 24. The respective protruding portions 12a play the role of preventing the protruding portion 12 from being swung in the pressure introduction port 24 to prevent the effect of swing of the protruding portion 12 from being exerted upon the sensor chip 30. The protruding portions 12a are formed on the side surface of the protruding portion 12 at three portions, for example, closer to the opening 23 than the sensor chip 30.

The number of protruding portions 12a is one example and, preferably, three or more protruding portions 12a are formed so as to prevent the swing of the protruding portion 12. In particular, as shown in FIG. 2, if the protruding portions 12a are formed at equal intervals, when the protruding portion 12 is swung, loads applied to the respective protruding portions 12a can be made nearly equal to each other. Here, the protruding portions 12a may be formed around the sensor chip 30, for example, on the back of the depressed portion 13, but to form the protruding portions 12a at equal intervals, it is preferable that the protruding portions 12a are formed on a portion closer to the opening 23 than the sensor chip 30. Moreover, if the direction in which the protruding portions 12a protrudes (radial direction from the center of the protruding portion 12) is vertical to the pressure receiving plane of the sensor chip 30, when the pressure medium collides with the protruding portions 12a, a region in which the pressure medium is lean is produced in the direction of the sensor 30 around the protruding portions 12a, and if the pressure receiving plane of the sensor chip 30 is in this region, it is difficult to detect the pressure of the pressure medium. In contrast to this, if three protruding portions 12a are formed, when the protruding portions 12a are arranged in such a way that a line connecting tips of two protruding portions 12a is parallel to the pressure receiving plane of the sensor chip 30, even if the pressure medium collides with the protruding portions 12a to cause pulsation, the pressure can be detected with high accuracy because the pressure medium is applied to the pressure receiving plane of the sensor chip 30. Further, it is preferable that the protruding portions 12a are formed in a shape in which the protruding portions 12a are put into point contact or line contact with the pressure introduction port 24 so as to reduce the friction and stress caused when the protruding portion 12 is inserted. The shape of the protruding portion 12a includes a semi-spherical shape and a circular shape in which a crest is put into line contact with the pressure introduction port 24.

Moreover, the protruding portions 12a may be not in contact with the wall surface of the pressure introduction port 24 but preferably is in contact with the wall surface of the pressure introduction port 24 so as to prevent the effect of swing of the protruding portion 12 from being exerted upon the sensor chip 30.

Furthermore, as shown in FIG. 1, the connector 10 has a ring-shaped groove 17 formed on the tip plane 11 so as to surround the protruding portion 12 and an O ring 41 for sealing and a backup ring 42 are arranged in the groove 17. It is preferable that the backup ring 42 is formed of resin and is employed when high pressure is measured. Here, the O ring 41 and the backup ring 42 correspond to sealing parts of the present disclosure.

The end portion on the receiving and depressed portion 21 side of the housing 20 is crimped on one end portion of the connector case 10 to form a crimp portion 25, whereby the interior of the housing 20 is sealed and the housing 20 and the connector case 10 are fixed to each other and integrated with each other.

The sensor chip 30 arranged on the protruding portion 12 of the connector case 10 includes: a gage part 31 that detects pressure and produces an electric signal of a level corresponding to its detection value; and a circuit part 32 having a control circuit having the functions of outputting a drive signal to the gage part 31, outputting a signal for detection to the outside, inputting an electric signal from the gage part 31, and performing a computing and amplifying processing to output the result of processing to the outside.

In this embodiment, the sensor chip 30 is formed, for example, in the shape of a rectangular plate, and the long sides of the rectangle are arranged in parallel to the introduction direction of the pressure medium and the short sides of the rectangular plate are arranged vertical to the introduction direction of the pressure medium.

Specifically, as shown in FIG. 3, the sensor chip 30 is constructed of: a plate-shaped first silicon substrate 33; an insulating layer 34 arranged on the first silicon substrate 33; and a second silicon substrate 35 arranged on the insulating layer 34. That is, the insulating layer 34 is sandwiched between the first silicon substrate 33 and the second silicon substrate 35.

In the first silicon substrate 33, the circuit part 32 is mounted on a plane on which the insulating layer 34 is formed. This circuit part 32 is constructed of a transistor device and various kinds of wiring, which are formed by a semiconductor process, and performs the processing of signals inputted from the gage part 31.

The insulating layer 34 is an electrically insulating film made of, for example, a silicon oxide film ($SiO_2$) and bonds and fixes the first silicon substrate 33 to the second silicon substrate 35 and acts as the insulating bonding layer of electrically insulating the first silicon substrate 33 from the circuit part 32.

Moreover, a hollow space 36 is formed in a laminated structure constructed of the respective silicon substrates 33, 35 and the insulating layer 34. This hollow space 36 is hermetically partitioned and constructed by covering a depressed portion, into which the insulating layer 34 is opened and formed by etching or the like, with the respective silicon substrates 33, 35. That is, the hollow space 36 is constructed as a pressure base chamber hermetically sealed and having a fixed pressure such as vacuum.

The gage part 31 is mounted at a position opposite to the hollow space 36 of the second silicon substrate 35. Specifically, a portion of the second silicon substrate 35 at a position opposite to the hollow space 36 is constructed as a diaphragm 31a as a sensing part. The diaphragm 31a is distorted by pressure from the pressure medium to be applied to a plane opposite to a plane on which the insulating layer 34 is formed in the second silicon substrate 35. That is, the plane opposite to the plane on which the insulating layer 34 is formed in the second silicon substrate 35 becomes the pressure receiving plane.

Further, as shown in FIG. 3, strain gages 31b are formed by implanting and diffusing impurities at positions opposite to the hollow space 36 in the diaphragm 31a. A bridge circuit is formed by these strain gages 31b and a change in resistance value caused by the strain of the diaphragm 31a can be detected by the bridge circuit. In this manner, the gage part 31 is constructed of the diaphragm 31a and the strain gages 31b.

These strain gages 31b are electrically connected to the circuit part 32 mounted on the first silicon substrate 33 and the pressure received by the diaphragm 31a is converted to an electric signal by the strain gages 31b and the electric signal is inputted to and processed by the circuit part 32.

The sensor chip 30 having this construction, as described above, is fixed to the depressed portion 13 formed in the protruding portion 12 of the connector case 10 via the adhesive 14. That is, as shown in FIG. 3, in the sensor chip 30, the first silicon substrate 33 or the second silicon substrate 35 is mounted in the depressed portion 13 so as to be parallel to the introduction direction of the pressure medium.

In the sensor chip 30, the strain gages 31b are mounted on one end side of the connector case 10 of the second silicon substrate 35, that is, on the pressure introduction passage side of the housing 20, and the circuit part 32 is mounted on the other end side of the connector case 10 of the first silicon substrate 33, that is, on the opening 16 side of the connector case 10.

While the sensor chip 30 formed in the shape of the rectangular plate has been described above, the shape of the plate of the sensor chip 30 is not limited to a rectangle but may be a square.

Further, the sensor chip 30 and the terminals 15 are connected to each other by the bonding wires 50, and the connection portion of the bonding wires 50 and the terminals 15 and the connection portion of the bonding wires 50 and the sensor chip 30 are sealed by the connector case 10. The signal processed by the circuit part 32 is outputted to the outside via the terminals 15.

Still further, a sealing material (not shown) is fixed to the bonding portion where the connector case 10 covering a portion of the second silicon substrate 35 is bonded to the second silicon substrate 35. With this, the pressure medium is prevented from entering the connector case 10 via the bonding portion where the second silicon substrate 35 is bonded to the connector case 10.

Next, a method for manufacturing the connector case 10 having the sensor chip 30 mounted therein and a method for manufacturing the above-mentioned pressure sensor will be described. First, the method for manufacturing the connector case 10 having the sensor chip 30 mounted therein will be described.

First, the terminals 15 and the sensor chip 30 are prepared. Specifically, plural terminals 15 are formed by pressing a metal plate of copper alloy. Moreover, the circuit part 32 is mounted on one plane of the plate-shaped first silicon substrate 33 and the insulating layer 34 is further formed over the first silicon substrate 33 so as to cover the circuit part 32. Then, a portion to become the hollow space 36 of the insulating layer 34 is opened by etching or the like. On the other hand, a part having the strain gages 31b formed on one plane of the second silicon substrate 35 is prepared, and the second silicon substrate 35 is placed on the insulating layer 34 so as to make the strain gages 31b be opposite to the hollow space 36.

In this regard, when the sensor chip 30 is formed, it is also possible to construct the sensor chip 30 by placing the first silicon substrate 33 having the circuit part 32 formed thereon on a substrate in which the insulating layer 34 and the hollow space 36 are formed on a plane having the strain gages 31b formed thereon in the second silicon substrate 35.

Then, a primary molded part having the plural terminals 15 inserted and molded and having the depressed portion 13 formed (shown in FIG. 3) is molded of PPS as primary molding. That is, the respective terminals 15 are set in the mold and melted resin is flowed into the mold and is solidified, whereby the primary molded part of resin is molded in the respective terminals 15.

In this case, the respective terminals 15 are inserted and molded in such a way that both ends of the respective terminals 15 are exposed from the primary molded part. Moreover, the depressed portion 13 is arranged on one end side of the terminals 15 so as to be depressed in a direction in which the terminals 15 are extended, or in more detail, in a direction vertical to the introduction direction of the pressure medium.

Subsequently, the sensor chip 30 is fixed in the depressed portion 13 formed in the primary molded part via the adhesive 14 and one ends of the respective terminals 15 are connected to the sensor chip 30 with the bonding wires 50.

Thereafter, the connector case 10 of a secondary molded part of resin is molded. That is, as described above, the primary molded part is molded and then is set in the mold of the connector case 10, and melted resin is flowed into the mold. With this, the connector case 10 of the secondary molded part having the protruding portion 12 protruding from the tip plane 11 of the connector case 10 and the groove 17 for receiving the O ring 14 and the like in the secondary molded part is molded.

In this case, the connection portions of the respective terminals 15 and the bonding wires, the connection portion of the sensor chip 30 and the bonding wire 50, and the bonding wires 50 are sealed with resin. Further, as shown in FIG. 3, the gage part 31 of the sensor chip 30 is exposed from the connector case 10, whereas the portion on the terminal 15 side of the sensor chip 30 is covered with resin.

Then, a sealing part (not shown) is fixed to the boundary between the sensor chip 30 and the connector case 10 to enhance a sealing ability. In this manner, the connector case 10 having the sensor chip 30 is completed.

Next, the method for manufacturing the above-mentioned pressure sensor will be described. First, the connector case 10 having the sensor chip 30 shown in FIG. 1 is prepared. Moreover, the backup ring 42 and the O ring 41 are arranged in the groove 17 formed on the tip plane 11 of the connector case 10.

On the other hand, the housing 20 having the threaded portion 22, the pressure introduction port 24, and the receiving and depressed portion 13 is prepared. Subsequently, while the housing 20 is held horizontal from above, the housing 20 is lowered on the connector case 10 so as to fit on the connector case 10.

Thereafter, the end portion of the housing 20 is crimped on the one end portion of the connector case 10 to form the crimp portion 25. In this manner, the housing 20 and the connector case 10 are integrated with each other, whereby the housing 20 is fitted on and fixed to the connector case 10 by the crimp portion 25. In this manner, the pressure sensor shown in FIG. 1 is completed.

The fundamental pressure detection action of the pressure sensor will be described.

The pressure sensor is mounted on the engine or the like in the vehicle as described above via the threaded portion 22 of the housing 20. An engine oil as the pressure medium is introduced into the pressure sensor through the pressure introduction port 24 from the opening 23 of the housing 20.

Then, the introduced pressure is applied to the diaphragm 31a of the gage part 31 of the sensor chip 30. Then, an electric signal responsive to the applied pressure is inputted as a sensor signal to the circuit part 32 from the gage part 31, and the sensor signal is subjected to a signal processing by the circuit part 32.

In this manner, the sensor signal processed by the circuit part 32 is transmitted to an external circuit via the bonding wire 50 and the terminal 15, whereby the pressure of the oil, for example, is detected. In this manner, pressure is detected by the pressure sensor.

As described above, this embodiment is characterized in that the depressed portion 13 is formed in the protruding portion 12 formed in the one end portion of the connector case 10 and that the pressure receiving plane of the sensor chip 30 is arranged in the depressed portion 13 so as to be parallel to the introduction direction of the pressure medium.

According to this construction, the width of the sensor chip 30 in a direction vertical to the pressure receiving plane of the sensor chip 30 can be reduced as compared with the case in which the pressure receiving plane of the sensor chip 30 is arranged in a direction vertical to the introduction direction of the pressure medium. With this, the size in the radial direction of the pressure sensor can be reduced and by extension the size of the pressure sensor can be reduced.

In this case, a sensor chip formed in the shape of a rectangular plate can be used as the sensor chip 30, and the sensor chip 30 can be arranged in the depressed portion 13 of the protruding portion 12 in such a way that the long sides of the rectangle are parallel to the introduction direction of the pressure medium and that the short sides of the rectangle are vertical to the introduction direction of the pressure medium. With this, the width of the sensor chip 30 in the introduction direction of the pressure medium on the pressure receiving plane of the sensor chip 30 can be further reduced and hence the size in the radial direction of the pressure sensor can be further reduced.

The pressure sensor is characterized in that the bonding wires 50 for connecting the sensor chip 30 to the terminals 15 are sealed by the connector case 10.

According to this, it is possible to prevent the pressure of the pressure medium from being applied directly to the bonding wires 50. Thus, it is possible to avoid the bonding wires 50 from being broken by the pulsation of the pressure medium and by extension to prevent the electric connection of the sensor chip 30 and the terminals 15 from being interrupted.

As described above, it is possible to reduce the size of the pressure sensor and to prevent the electric connection of the sensor chip 30 and the terminals 15 from being interrupted.

Second Embodiment

In this embodiment, only parts different from those in the first embodiment will be described. In the first embodiment, the connector case 10 and the housing 20 are sealed by the O ring 41 or the like, but this embodiment is characterized by employing a gasket.

Figure 4:
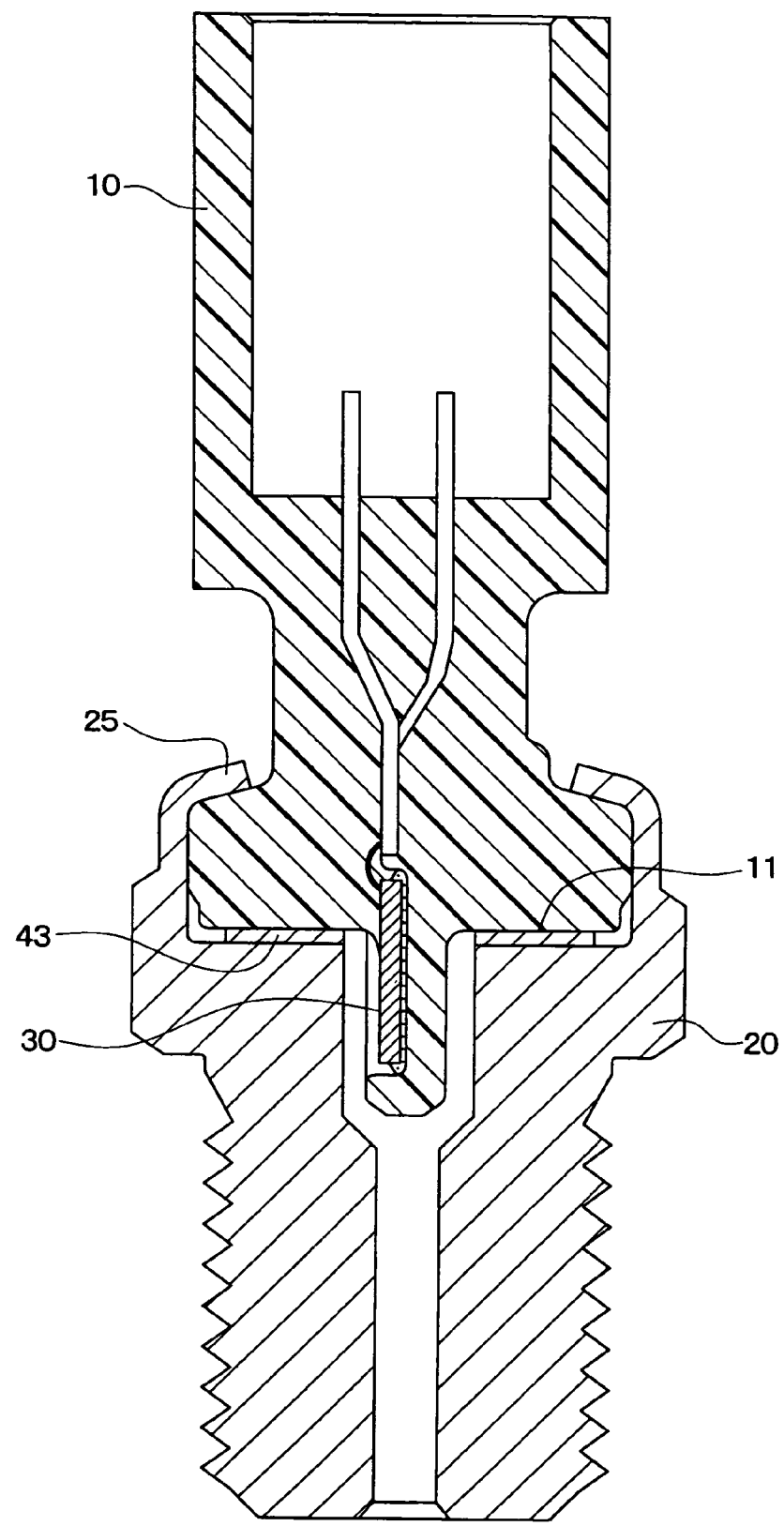
FIG. 4 is a schematic sectional view of a pressure sensor according to a second embodiment of the present disclosure.

FIG. 4 is a schematic sectional view of a pressure sensor according to a second embodiment of the present disclosure. As shown in this drawing, the groove 17 shown in FIG. 1 is not formed on the tip plane 11 of the connector case 10 but the tip plane 11 is formed in an end plane. Moreover, a metal gasket 43 is arranged on the other end side of the housing 20, that is, between the end on the receiving and depressed portion 13 side of the housing 20 and the connector 10.

The one end portion of the connector case 10 is inserted into a receiving and depressed portion 21 of the housing 20, and the end portion of the housing 20 is crimped on the one end portion of the connector 10 to form the crimp portion 25. With this, the interior of the housing 20 is sealed by the gasket 43, and the housing 20 and the connector 10 are fixed to and integrated with each other. In this manner, the interior of the housing 20 can be sealed by the gasket 43.

Here, as for the gasket 43, one layer of gasket 43 may be arranged or multiple layers of gaskets 43 may be arranged. Moreover, the gasket 43 is not limited to a gasket made of metal but a gasket made of resin can be employed.

Third Embodiment

Figure 5:
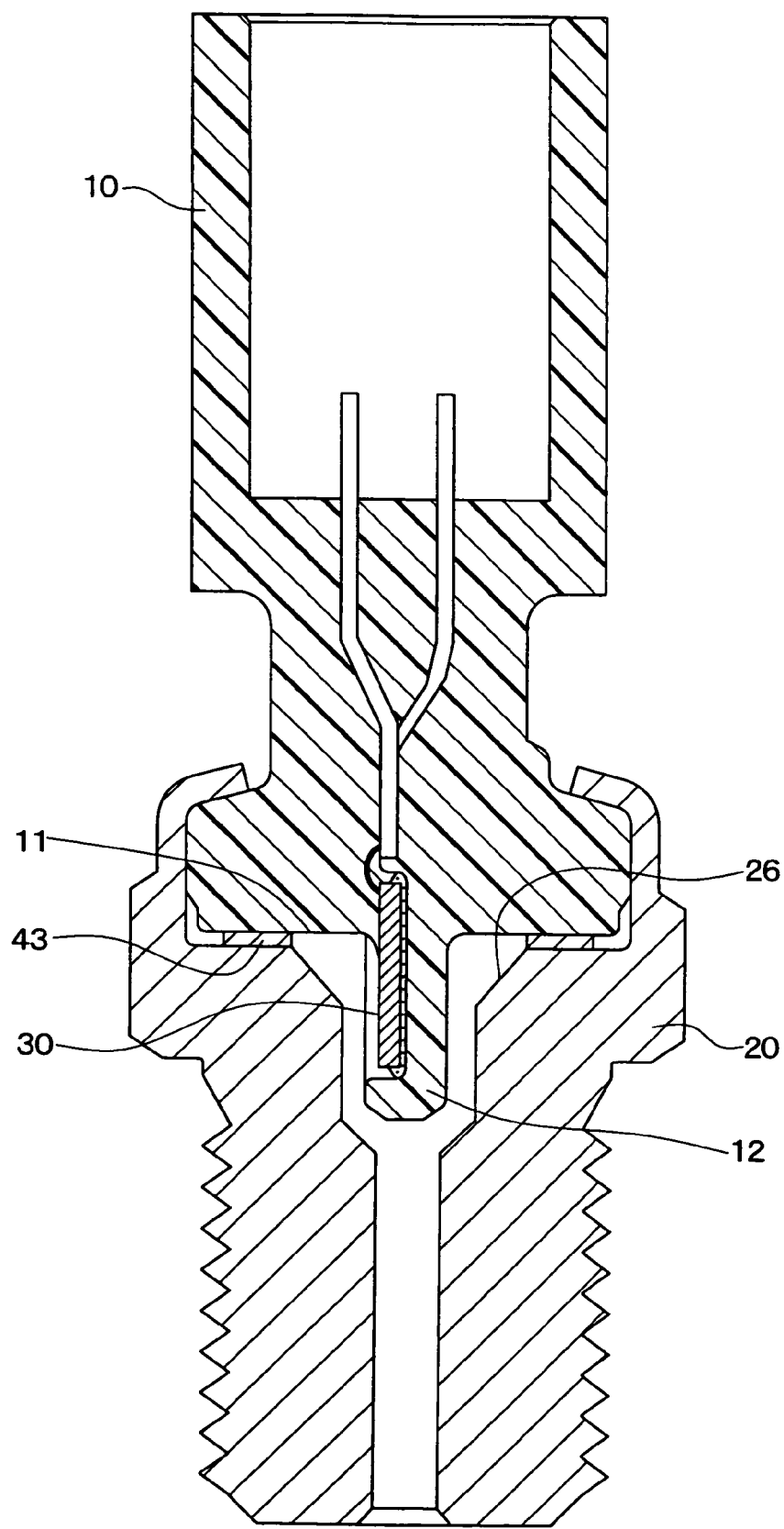
FIG. 5 is a schematic sectional view of a pressure sensor according to a third embodiment of the present disclosure.

In this embodiment, only parts different from those in the second embodiment will be described. FIG. 5 is a schematic sectional view of a pressure sensor according to a third embodiment of the present disclosure. As shown in this drawing, a tapered plane 26 is formed on the opening portion on the other end side of the housing 20 of the pressure introduction port 24 formed in the housing 20.

According to this, when the one end portion of the connector 10 is inserted into the depressed portion 13 as the receiving and depressed portion of the housing 30, the protruding portion 12 protruding from the tip plane 11 of the connector case 10 can be inserted into the pressure introduction port 24 while sliding on the tapered plane 26. Thus, the connector case 10 can be easily mounted in the housing 20.

The tapered plane 26 of the housing 20 can be also employed for the housing 20 according to the first embodiment.

Fourth Embodiment

Figure 6:
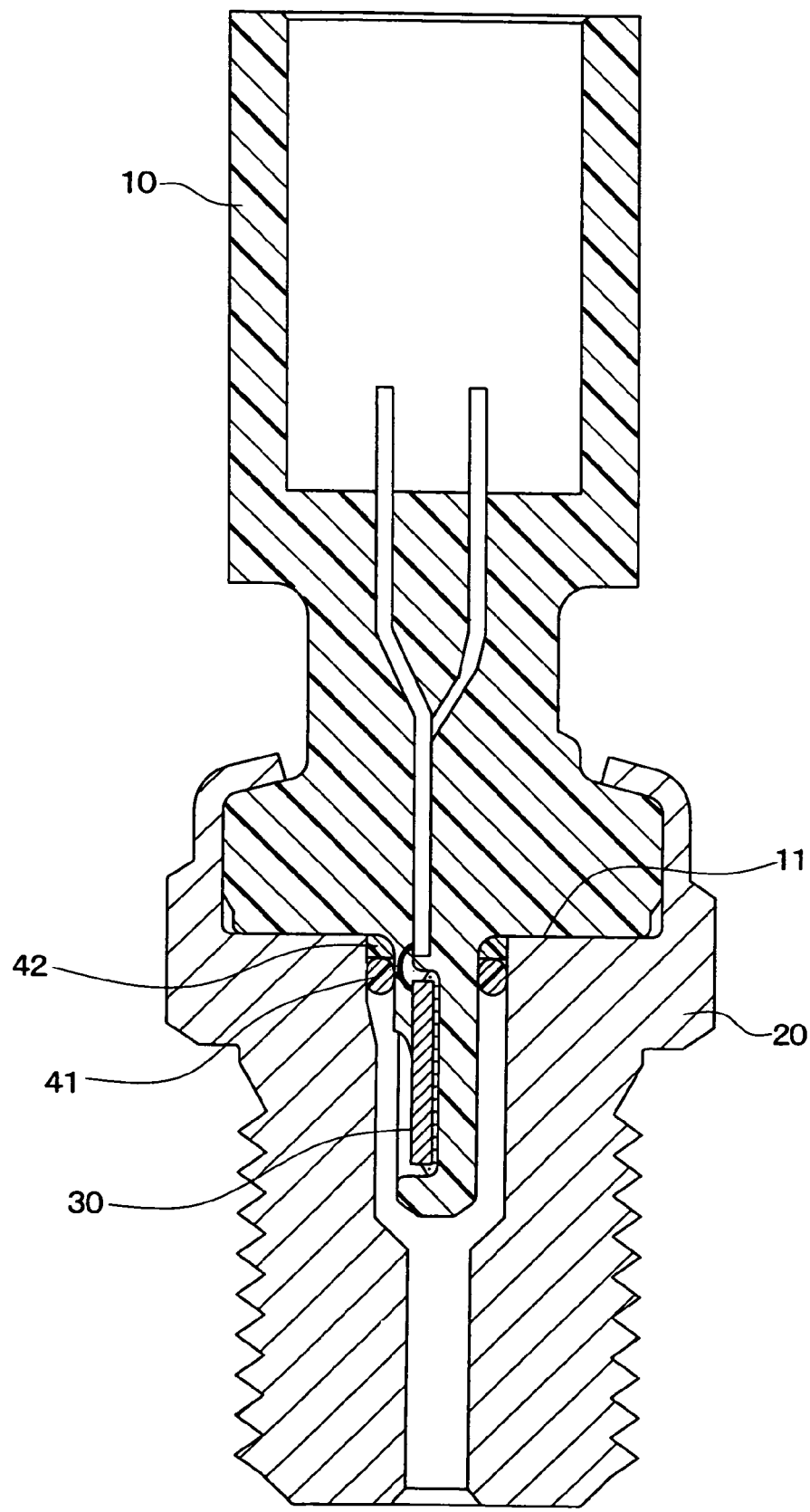
FIG. 6 is a schematic sectional view of a pressure sensor according to a fourth embodiment of the present disclosure.

In this embodiment, only parts different from those in the first embodiment will be described. FIG. 6 is a schematic sectional view of a pressure sensor according to a fourth embodiment of the present disclosure. As shown in this drawing, the groove 17 shown in FIG. 1 is not formed on the tip plane 11 of the connector case 10 but the tip plane 11 is formed in a flat plane. Moreover, the protruding portion 12 protruding from the tip plane 11 of the connector case 10 has the backup ring 42 and the O ring 41 arranged thereon in this order from the tip plane 11 side. In other words, the backup ring 42 and the O ring 41 are arranged between the side surface of the protruding portion 12 and the wall surface of the pressure introduction port 24.

According to this, the backup ring 42 and the O ring 41 can seal a shaft and hence the size of the pressure sensor can be further reduced. Moreover, since the backup ring 42 and the O ring 41 are arranged in the introduction direction of the pressure medium, the stress applied to the connector case 10 can be reduced.

Fifth Embodiment

Figure 7:
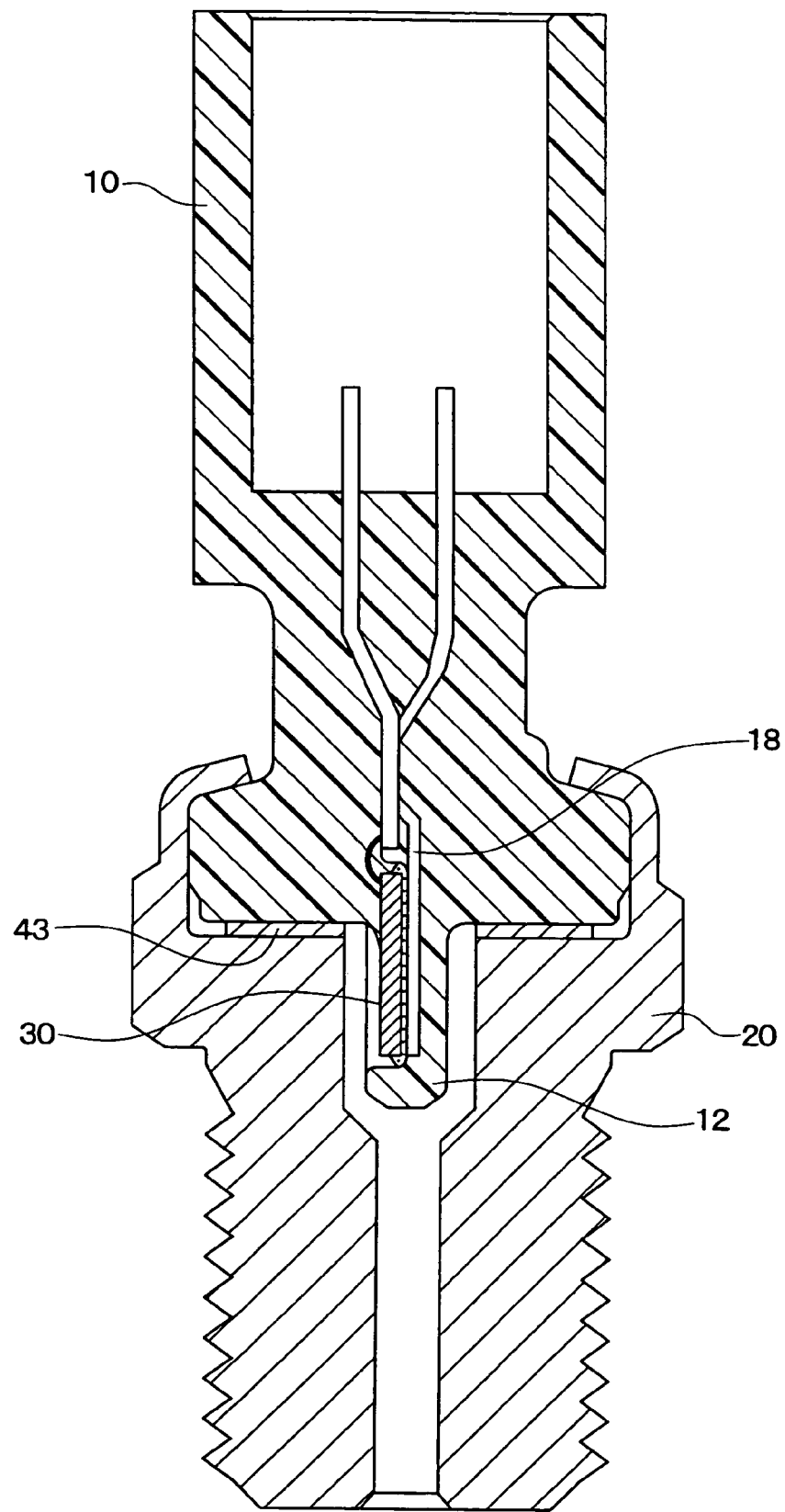
FIG. 7 is a schematic sectional view of a pressure sensor according to a fifth embodiment of the present disclosure.

In this embodiment, only parts different from those in the second embodiment will be described. FIG. 7 is a schematic sectional view of a pressure sensor according to a fifth embodiment of the present disclosure. As shown in this drawing, a reinforcing terminal 18 is inserted and molded in the connector case 10 so as to be exposed to the bottom plane of the depressed portion 13 of the connector case 10.

The reinforcing terminal 18 is arranged opposite to the sensor chip 30 and parallel to the introduction direction of the pressure medium, and the sensor chip 30 is fixed on the reinforcing terminal 18. The reinforcing terminal 18 is used as a part for fixing the sensor chip 30 and does not contribute to the electric connection.

The reinforcing terminal 18 like this is inserted and molded in the primary molded part along with the other terminals 15 when the primary molded part is molded in the manufacture of the connector case 10. In this case, the reinforcing terminal 18 is inserted and molded so as to be exposed to the bottom plane of the depressed portion 13 formed in the primary molded part, and the sensor chip 30 is fixed to the top of the reinforcing terminal 18 exposed to the bottom surface of the depressed portion 13 via the adhesive 14. Thereafter, when the secondary molded part is molded, the reinforcing terminal 18 is sealed with resin.

As described above, the reinforcing terminal 18 is mounted on the opposite side of the pressure receiving plane in the sensor chip 30, so it is possible to prevent the protruding portion 12 from being deformed in the introduction direction of the pressure medium. This reinforcing terminal 18 can be employed not only in the second embodiment but also in the first, third, and fourth embodiments.

Here, the sensor chip 30 may be not mounted on the reinforcing terminal 18 but may be inserted and molded simply in the connector case 10. Even in this mode, it is possible to reinforce the protruding portion 12 in the introduction direction of the pressure medium.

Sixth Embodiment

Figure 8:
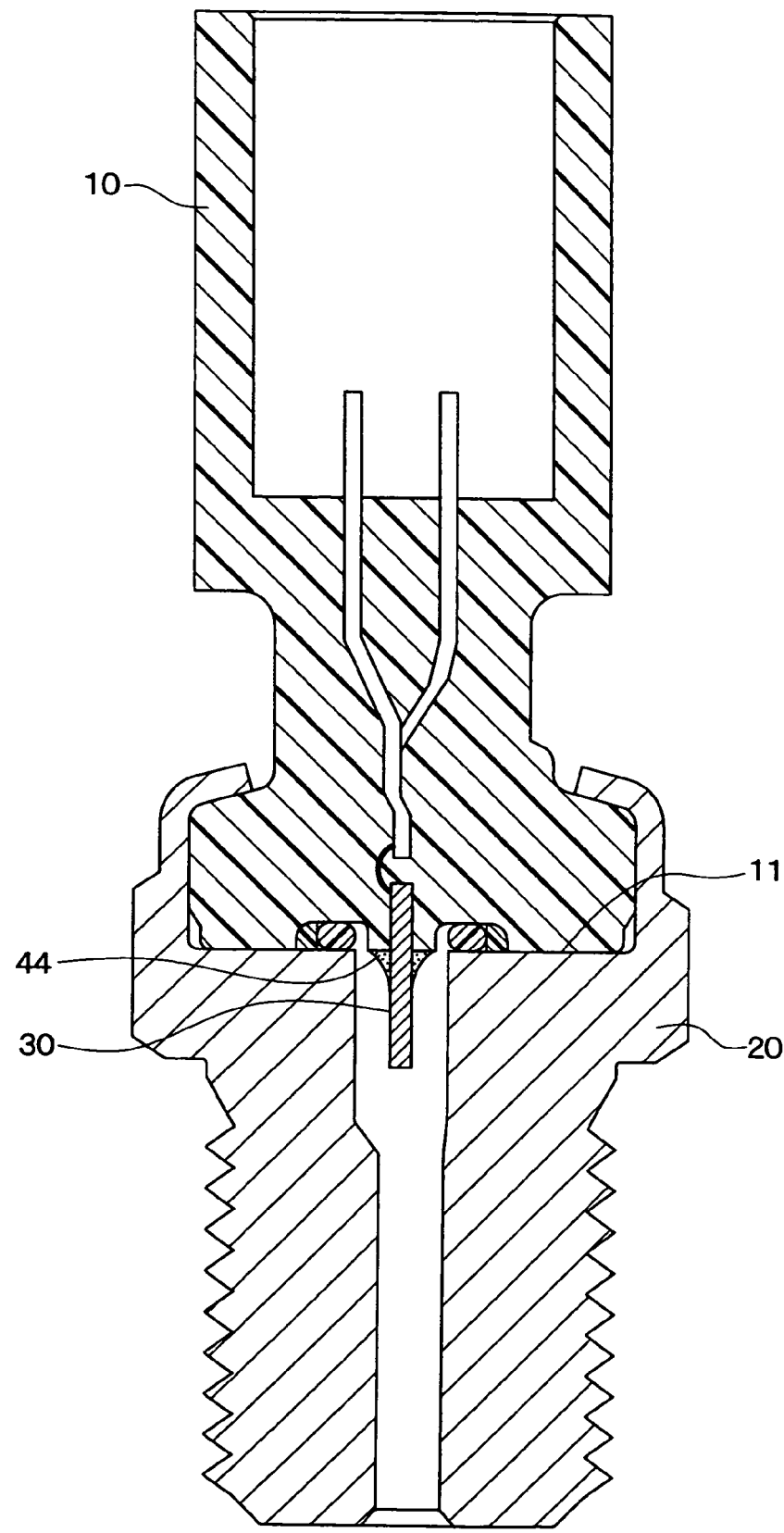
FIG. 8 is a schematic sectional view of a pressure sensor according to a sixth embodiment of the present disclosure.

In this embodiment, only parts different from those in the first embodiment will be described. FIG. 8 is a schematic sectional view of a pressure sensor according to a sixth embodiment of the present disclosure. As shown in this drawing, in this embodiment, the protruding portion 12 protruding from the tip plane 11 of the connector 10 is not formed but the sensor chip 30 is protruded from the tip plane 11.

A sealing part 44 is disposed in the boundary portion between the tip plane 11 and the sensor chip 30. With this, the pressure medium is prevented from entering the boundary between the sensor chip 30 and the tip plane 11 of the connector case 10.

This connector case 10 can be manufactured by bonding and fixing the sensor chip 30 to the primary molded part and by molding the secondary molded part in such a way that the sensor chip 30 protrudes from the tip plane 11.

As described above, since the protruding portion 12 is not molded, the size of the pressure sensor can be reduced by the thickness of the protruding portion 12 in the direction vertical to the introduction direction of the pressure medium.

Seventh Embodiment

Figure 9:
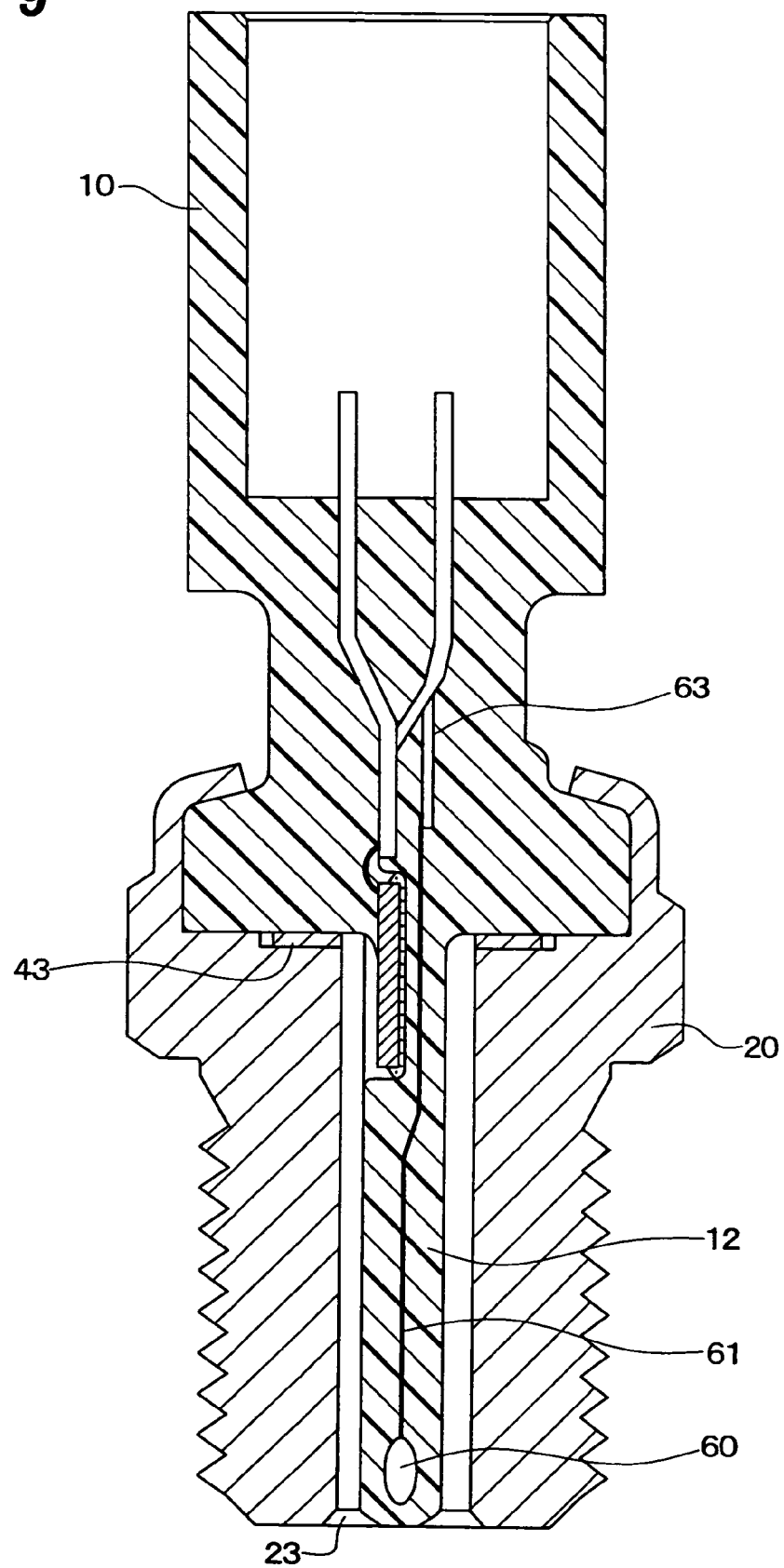
FIG. 9 is a schematic sectional view of a pressure sensor according to a seventh embodiment of the present disclosure.

In this embodiment, only parts different from those in the second embodiment will be described. FIG. 9 is a schematic sectional view of a pressure sensor according to a seventh embodiment of the present disclosure. As shown in this drawing, in this embodiment, the protruding portion 12 protruding from the tip plane 11 of the connector case 10 is molded so as to extend to the opening 23, and a thermistor 60 is inserted and molded in the tip portion of the protruding portion 12. In this manner, the pressure sensor according to this embodiment is a complex sensor for detecting pressure and temperature.

The thermistor 60 is a temperature detection device for producing a physical quantity, that is, voltage of a level responsive to temperature. This thermistor 60 is connected to one end portion of a terminal 63 for thermistor via a lead wire 61. Moreover, the other end of the terminal 63 for thermistor is inserted and molded in the connector case 10 so as to be exposed in the opening 16 of the connector case 10.

Here, the thermistor 60 may be molded so as to be exposed from the tip of the protruding portion 12. In this case, not only the thermistor 60 but also a device for detecting a physical quantity different from the pressure and producing an electric signal of a level responsive to its detection value, for example, a temperature sensor for measuring intake air, a moisture sensor, a flow rate sensor, and a gas sensor can be employed.

In this embodiment, the connector case 10 and the housing 20 are sealed by the gasket 43. As shown in the first and fourth embodiments, they can be also sealed by the use of the O ring 41 or the like.

This connector case 10 can be manufactured in the following manner: that is, the primary molded part is molded in which the respective terminals 15 and the terminal 63 for thermistor are inserted in and molded of resin in such a way that their both ends are exposed; the lead wire 61 is connected to the terminal 63 for thermistor; the sensor chip 30 is mounted in the depressed portion 13 as described above; and then the secondary molded part is molded.

As described above, a sensor for detecting two physical quantities of pressure and temperature can be constructed by inserting and molding the thermistor 60 in the tip portion of the protruding portion 12. The thermistor 60 like this can be employed also in the first and third to fifth embodiments.

Eighth Embodiment

Figure 10:
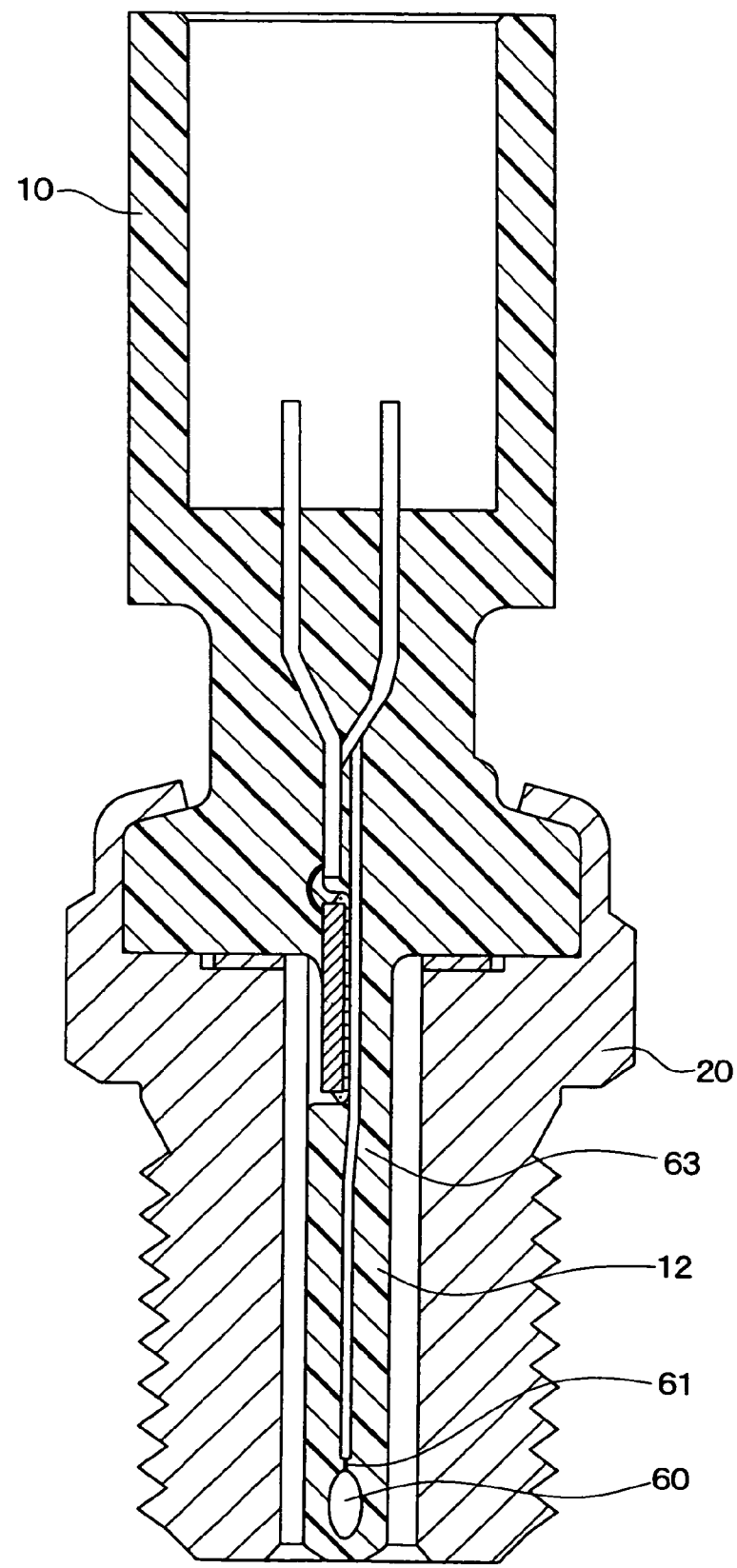
FIG. 10 is a schematic sectional view of a pressure sensor according to an eighth embodiment of the present disclosure.

In this embodiment, only parts different from those in the seventh embodiment will be described. FIG. 10 is a schematic sectional view of a pressure sensor according to an eighth embodiment of the present disclosure. As shown in this drawing, the terminal 63 for thermistor has a length reaching the tip of the protruding portion 12. With this, the terminal 63 for thermistor can be made to function as a reinforcing part and hence can prevent the protruding portion 12 from being deformed in the introduction direction of the pressure medium.

Ninth Embodiment

In this embodiment, only parts different from those in the respective embodiments will be described. In the respective embodiments, the bonding wires 50 for connecting the sensor chip 30 to the terminals 15 are sealed with resin constructing the connector 10, whereby the pressure of the pressure medium is prevented from being directly applied to the bonding wires 50. However, this embodiment is characterized in that the bonding wires 50 themselves are eliminated.

Figure 11:
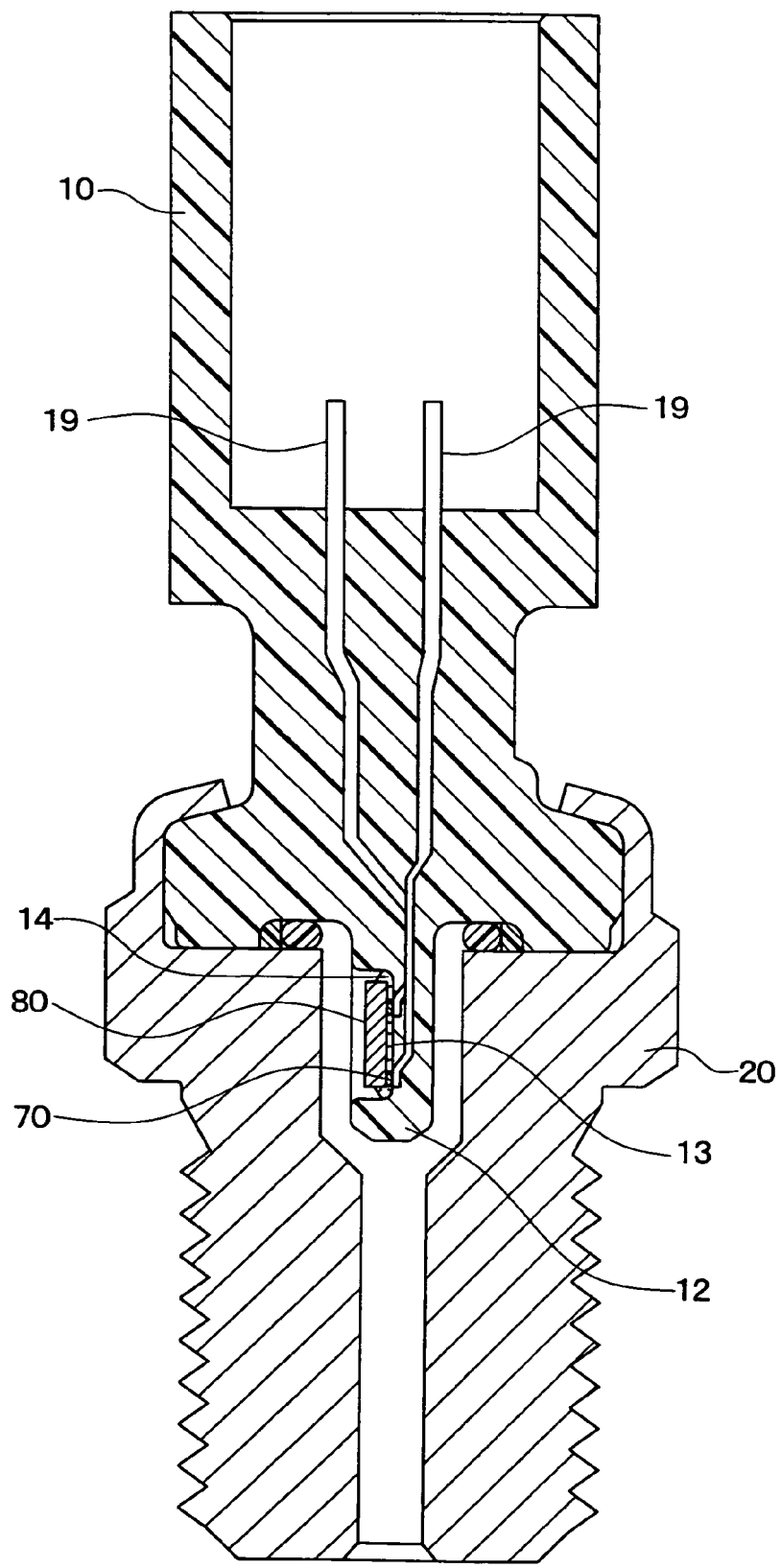
FIG. 11 is a schematic sectional view of a pressure sensor according to a ninth embodiment of the present disclosure.

FIG. 11 is a schematic sectional view of a pressure sensor according to a ninth embodiment of the present disclosure. As shown in this drawing, terminals 19 the one ends of which are arranged in the protruding portion 12 and the other ends of which are exposed in the opening 16 are inserted and molded in the connector case 10.

The one ends of this terminals 19 are exposed to the bottom of the depressed portion 13 formed in the protruding portion 12, and bumps 70 are formed at the exposed portions, and a sensor chip 80 is connected to the tops of the bumps 70. An adhesive 14 is interposed between the bottom of the depressed portion 13 and the sensor chip 80, and the sensor chip 80 is fixed to the depressed portion 13.

Figure 12:
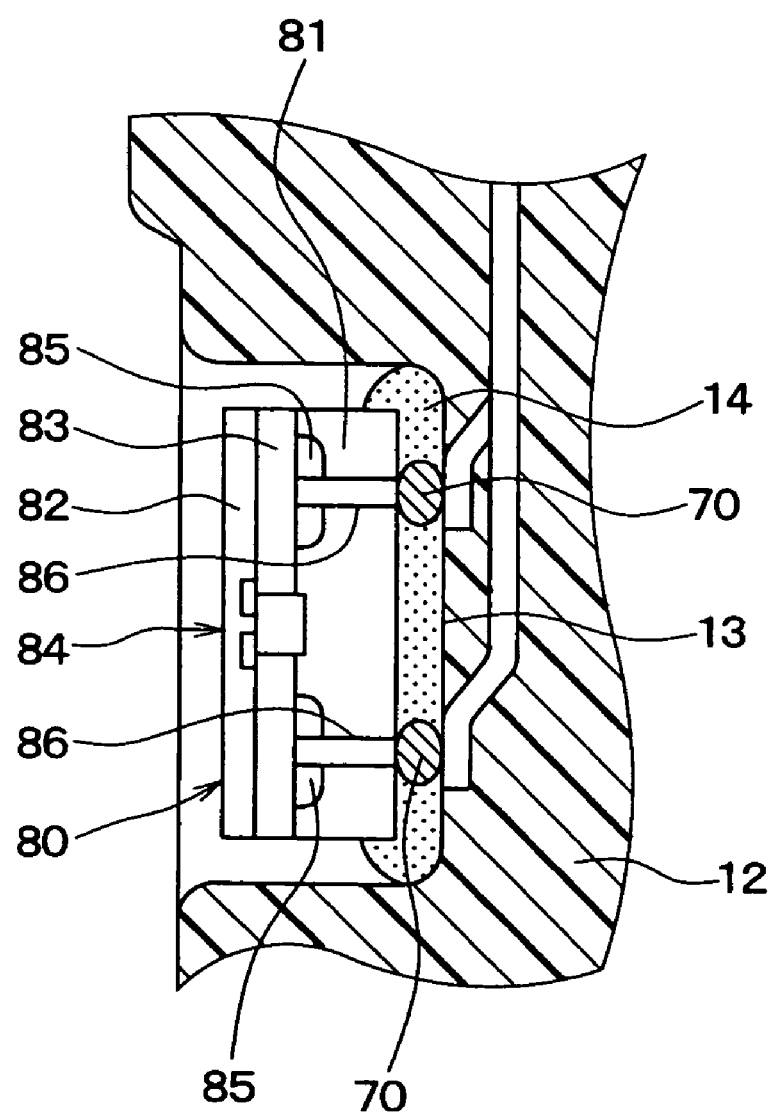
FIG. 12 is an enlarged sectional view of a portion near a sensor chip shown in FIG. 11.

FIG. 12 is an enlarged view of a portion near the sensor chip 80 shown in FIG. 11. The sensor chip 80, like the first embodiment, is constructed in such a way that an insulating layer 83 is sandwiched between the first silicon substrate 81 and the second silicon substrate 82.

As shown in FIG. 12, in this embodiment, the gage part 84 is arranged in the center of the sensor chip 80, and circuit parts 85 are arranged on the opening 16 side of the connector case 10 and on the opening 23 side of the housing 20, respectively. The circuit parts 85 are arranged, for example, so as to surround the periphery of the gage part 84 or in the shape of a letter C.

Moreover, the first silicon substrate 81 has wiring parts 86 formed, the wiring parts 86 being extended on a plane opposite to the plane on which the circuit parts 85 are formed. These wiring parts 86 and the bumps 70 are electrically connected to each other, whereby the circuit parts 85 are electrically connected to the terminals 19.

In the case of manufacturing the connector case 10 mounted with this sensor chip 80, the primary molded part is molded in such a way that both ends of the terminals 19 are exposed and that the one end portions of the terminals 19 are exposed from the depressed portion 13. Subsequently, the sensor chip 80 is mounted on the one end portions of the terminals 19 via the bumps 70 and the sensor chip 80 is fixed to the depressed portion 13 with the adhesive 14. Thereafter, the secondary molded part having the protruding portion 12 and the opening 16 is molded, whereby the connector case 10 is completed.

According to this construction, the bonding wires are not used for electrically connecting the sensor chip 80 and the terminals 19, so that there is not presented a problem that the bonding wires are broken by the pressure of the pressure medium. Thus, it is possible to prevent the electric connection of the sensor chip 80 and the terminals 19 from being interrupted.

Tenth Embodiment

Figure 13:
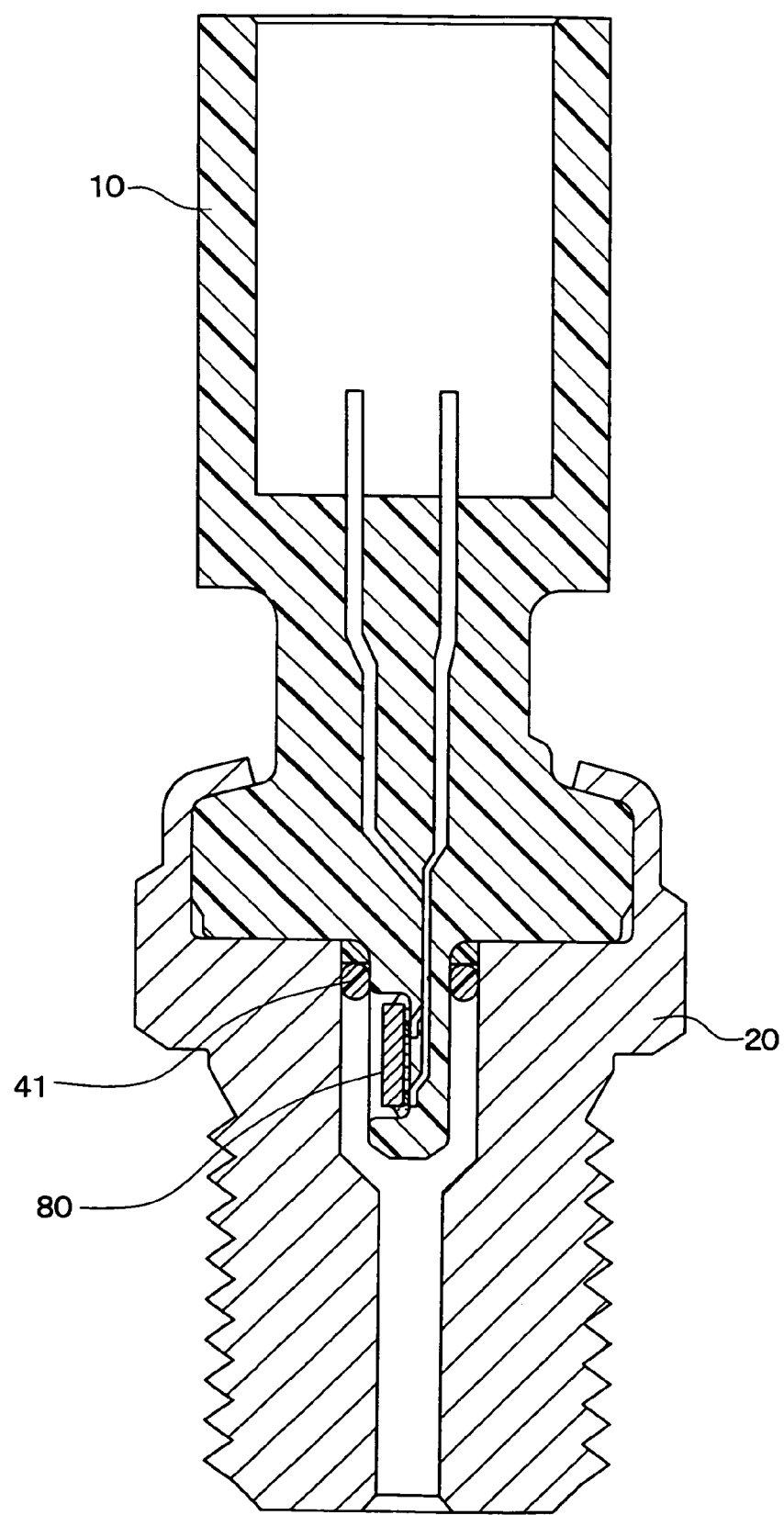
FIG. 13 is a schematic sectional view of a pressure sensor according to a tenth embodiment of the present disclosure.

In this embodiment, only parts different from those in the ninth embodiment will be described. FIG. 13 is a schematic sectional view of a pressure sensor according to a tenth embodiment of the present disclosure. As shown in FIG. 13, like the second embodiment, it is possible to arrange the O ring and the like and to seal the connector case 10 and the housing 20.

Eleventh Embodiment

Figure 14:
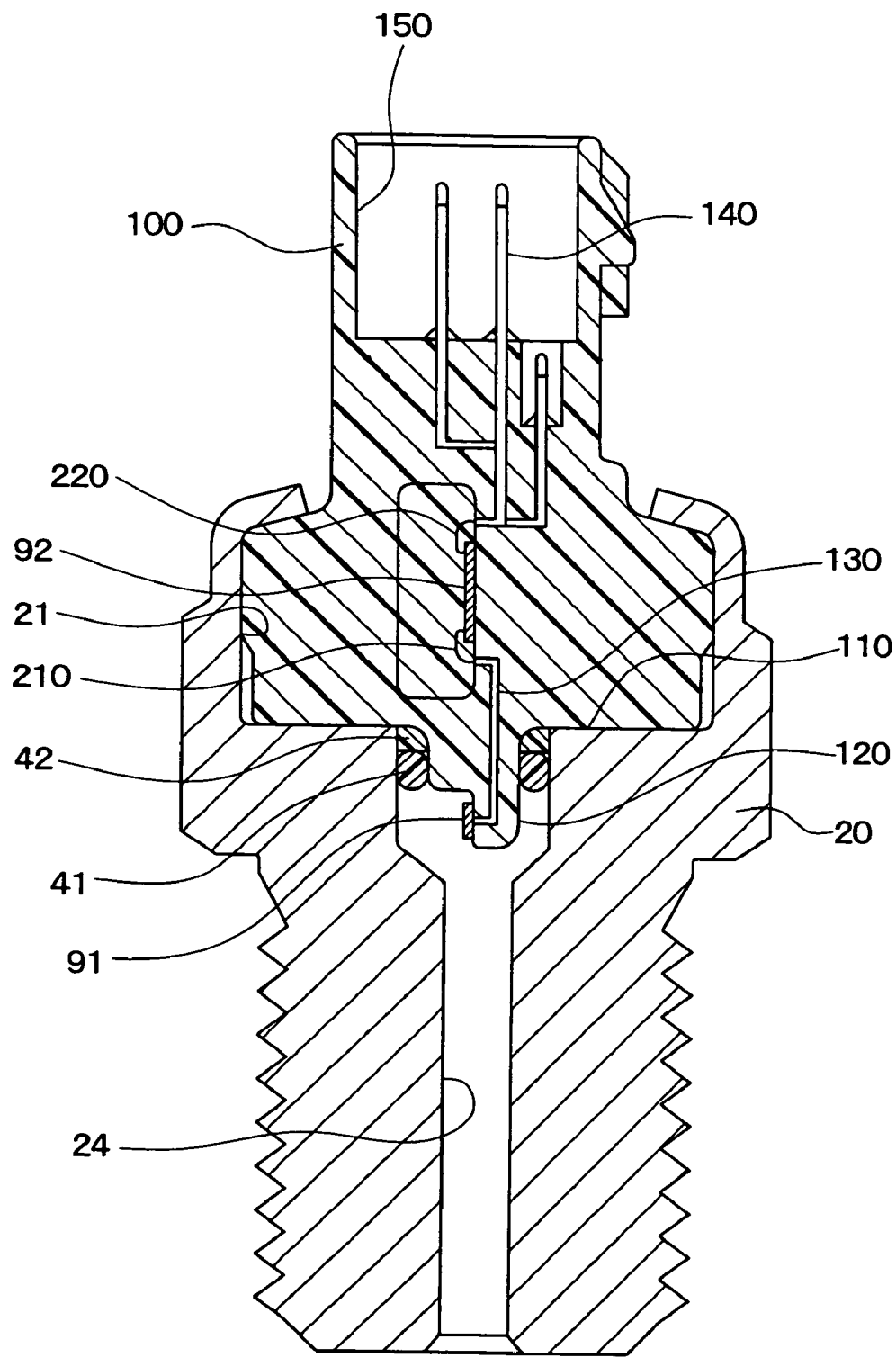
FIG. 14 is a schematic sectional view of a pressure sensor according to an eleventh embodiment of the present disclosure.

In this embodiment, only parts different from those in the respective embodiments will be described. FIG. 14 is a schematic sectional view of a pressure sensor according to an eleventh embodiment of the present disclosure. As shown in this drawing, in this embodiment, a first chip 91 shaped like a plate and mounted with a gage part is mounted on the side portion of a protruding portion 120 protruding from the tip end plane 110 of a connector case 100, and a second chip 92 shaped like a plate and mounted with a circuit part is inserted and molded in the connector case 100. A sealing part (not shown) is mounted on the side portion of the first chip 91. The respective chips 91, 92 have their planes arranged parallel to the introduction direction of the pressure medium.

The first chip 91 mounted on the protruding portion 120 has the one end portion of a terminal 130 for internal connection connected thereto, the terminal 130 being inserted and molded in the connector case 100. Moreover, the other end of the terminal 130 for internal connection is connected to the second chip 92 inserted and molded in the connector case 100 via a first bonding wire 210. The second chip 92 is connected to the one end portion of a terminal 140 for external connection via a second bonding wire 220, and the other end of the terminal 140 for external connection is exposed in an opening 150 of the connector case 100.

In the case of manufacturing the connector case 100, as described above, the primary molded part having the respective terminals 130, 140 inserted and molded therein is molded, and the respective chips 91, 92 are mounted and are electrically connected to each other by the bonding wires 210, 220. Thereafter, the secondary molded part is molded so as to seal the second chip 92 and the respective bonding wires 210, 220, whereby the connector case 100 is completed.

In this case, the terminal 130 for inner connection, the connection portion of the terminal 130 for inner connection and the first bonding wire 210, the first bonding wire 210, the connection portion of the first bonding wire 210 and the second chip 92, the second chip 92, the connection portion of the second chip 92 and the second bonding wire 220, the second bonding wire 220, the connection portion of the second bonding wire 220 and the other end of the terminal 140 for external connection are sealed by the connector case 100.

The backup ring 42 and the O ring 41 are interposed between the wall surface of the protruding portion 120 and the wall surface of the pressure introduction port 24, and the connector case 100 is received in the depressed portion 13 as the receiving and depressed portion of the housing 20, and the end portion of the housing is crimped on the connector case 100.

As described above, the first chip 91 having the gage part formed thereon and the second chip 92 having the circuit part formed thereon can be mounted separately in the connector case 100.

Twelfth Embodiment

Hereinafter, a twelfth embodiment of the present disclosure will be described with reference to the drawings. A pressure sensor shown in this embodiment is mounted in, for example, an automobile and is used as a pressure sensor for detecting the pressure of fuel, the pressure of oil for lubricating an engine and a drive system, the pressure of refrigerant of an air conditioner, and the pressure of exhaust gas.

Figure 15:
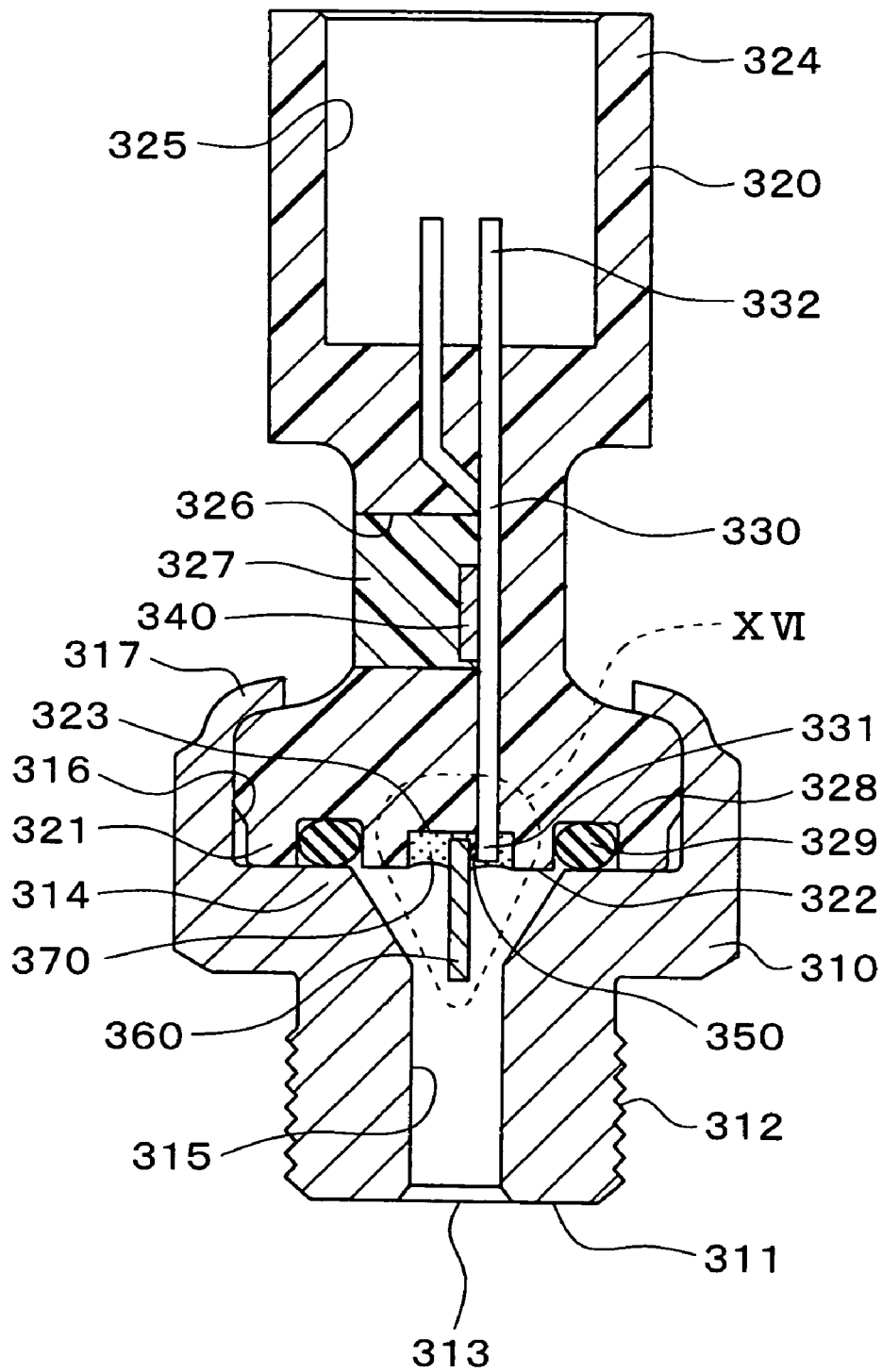
FIG. 15 is a schematic sectional view of a pressure sensor according to a twelfth embodiment of the present disclosure.
Figure 16:
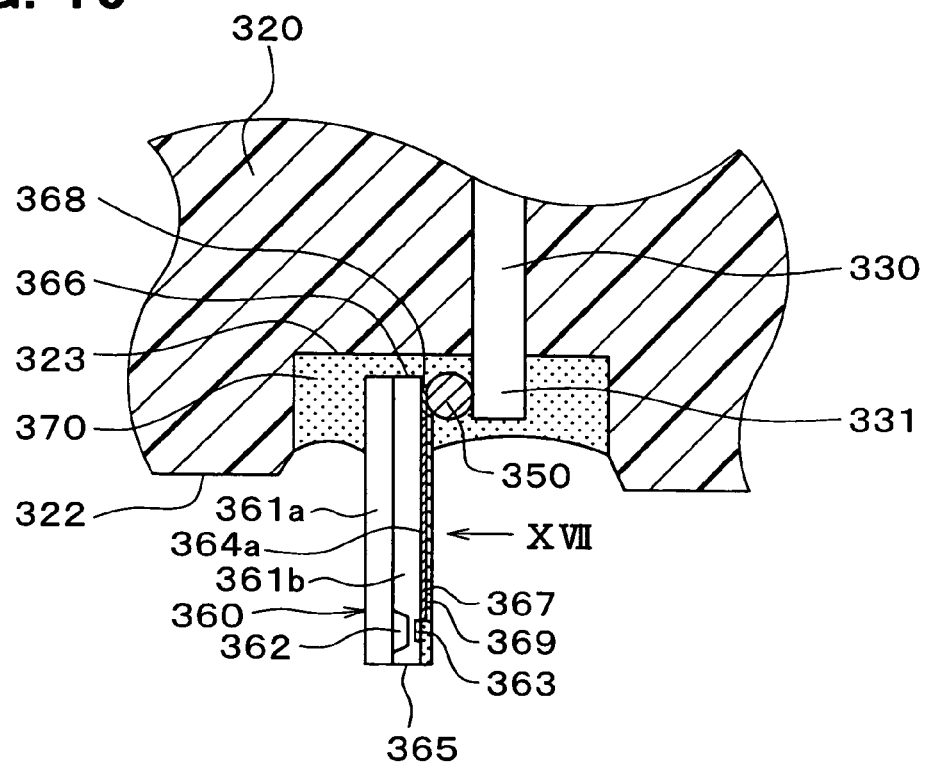
FIG. 16 is an enlarged sectional view of a portion XVI in FIG. 15.
Figure 17:
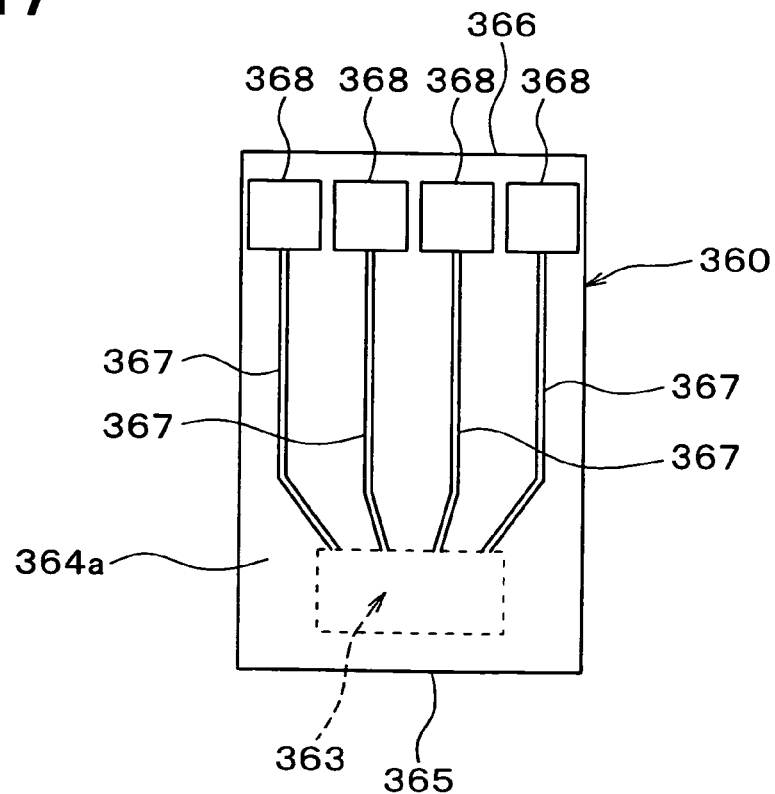
FIG. 17 is a view when viewed from a direction shown by an arrow XVII in FIG. 16.

FIG. 15 is a schematic sectional view of a pressure sensor according to the twelfth embodiment of the present disclosure. FIG. 16 is an enlarged view of a portion XVI in FIG. 15. FIG. 17 is a view when viewed from a direction shown by an arrow XVII in FIG. 16. As shown in FIG. 15, the pressure sensor is constructed of a housing 310 and a case 320.

The housing 310 is a case that is formed of metal in a hollow shape by cutting or cold forging. The housing 310 has a threaded portion 312 formed on the outer peripheral surface of its one end portion 311, the threaded portion 312 being to be screwed in a body to be measured. Moreover, the housing 310 has a pressure introduction port 315 formed in the one end portion 311, the pressure introduction port 315 being extended from an opening 313 formed in the one end portion of the housing 310 to the other end portion 314 of the housing 310. This pressure introduction port 315 acts as a pressure introduction passage. In the housing 310 like this, a pressure medium enters the opening 313 of the housing 310 to the other end portion 314 thereof through the pressure introduction port 315.

Hereinafter, the direction in which the pressure medium flows through the pressure introduction passage from the opening 313 on the one end portion 311 of the housing 310 to the other end portion 314 is referred to as the introduction direction of the pressure medium.

The case 320 is a connector for outputting a signal showing the value of pressure detected by the pressure sensor and is molded by molding resin such as PPS (poly-phenylene sulfide) and PBT (poly-butylene terephthalate) by the use of a mold. In this embodiment, the case 320 is molded, for example, in the shape of a circular column.

On a tip plane 322 at one end portion 321 of this case 320, there is formed a groove portion 323 depressed in the introduction direction of the pressure medium from the tip plane 322. Plural terminals 330, each of which is constructed of a bar-shape part made of metal, are inserted and molded in the case 320. The one end portions 331 of the respective terminals 330 are inserted and molded in the case 320 so as to be exposed to the groove portion 323.

On the other hand, the other end portions 332 of the respective terminals 330 are arranged so as to be exposed in an opening 325 formed in the other end portion 24 of the case 320. That is, the other end portion 324 in which the opening 325 is formed in the case 320 is constructed as a connector portion in the pressure sensor along with the other end portions 332 of the respective terminals 330 located in the opening 325. In other words, an external connector (not shown) is connected to the opening 325 and is electrically connected to an ECU or the like of the automobile via a wiring part. An electrically conductive material such as copper is employed as the material of the terminals 330.

Moreover, a groove portion 326 depressed in a direction vertical to the introduction direction of the pressure medium is formed on the side portion of the case 320. The terminals 330 are exposed to the bottom of this groove portion 326. A circuit board 340 is mounted on the terminals 330 exposed in the groove portion 326.

The circuit board 340 has a control circuit and the like formed thereon, the control circuit having the functions of: outputting a drive signal to a gage part 363 to be described later; outputting a signal for detection to the outside; inputting an electric signal from the gage part 363; and performing a computing and amplifying processing to output a processing result to the outside. The groove portion 326 is closed, for example, by a cover 327 and hence the circuit board 340 is protected from the outside.

Moreover, the case 320 has a sensor chip 360 electrically connected to the one end portions 331 of the terminal 330 via bumps 350.

As shown in FIG. 16, the sensor chip 360 is constructed of a first silicon substrate 361a as a plate-shaped base and a second silicon substrate 361b arranged on the first silicon substrate 361a. Moreover, a hollow space 362 is formed in a laminated structure constructed of the respective silicon substrates 361a, 361b. This hollow space 362 is constructed by covering a depressed portion, which is formed by removing the second silicon substrate 361b on the side of a plane facing the first silicon substrate 361a by etching or the like, with the first silicon substrate 361a. That is, the hollow space 362 is constructed as a pressure base chamber that is hermetically sealed and which has a fixed pressure such as vacuum. Here, the first silicon substrate 361a as the base may be formed of glass material.

Of the second silicon substrate 361b, a portion corresponding to the hollow space 362 in a plane on a side opposite to a side facing the first silicon substrate 361a is constructed as a diaphragm as a sensing part. A gage part 363 for detecting pressure is mounted on this diaphragm. Of the diaphragm, a plane on a side opposite to a plane on the first silicon substrate 361a side becomes a pressure receiving plane. The gage part 363 has a bridge circuit formed thereon by implanting and diffusing impurities and detects a change in the resistance value of the bridge circuit caused by the distortion of the diaphragm.

As shown in FIG. 16 and FIG. 17, the gage part 363 is arranged at a portion that is a portion of one plane 364a, opposite to a side facing the first silicon substrate 361a, of the second silicon substrate 361b and which is located on a side close to one side plane 365 vertical to the one plane 364a, and the bumps 350 are arranged at a portion that is a portion of the one plane 364a and which is located on the side of a side plane 366 opposite to the one side plane 365. In other words, the gage part 363 is arranged at a portion that is a portion of the one plane 364a of the sensor chip 360 and which is located on the side of the opening 313 of the housing 310.

The gage part 363 is electrically connected to pads 368 via wiring 367 extended from the one side plane 365 of the second silicon substrate 361b to the side plane 366 opposite to the one side plane 365. With this, the pressure received by the diaphragm is converted to an electric signal by the gage part 363, and this electric signal is inputted to the circuit board 340 via the wiring 367, the pads 368, the bumps 350, and the terminals 330. The wiring 367 and a portion of the pads 368 are covered and protected by a protecting film 369.

The sensor chip 360 is shaped like a rectangular plate, and the long sides of the rectangular plate are arranged in parallel to the introduction direction of the pressure medium and the short sides of the rectangular plate are arranged vertically to the introduction direction of the pressure medium. In this case, the one plane 364a of the second silicon substrate 361b is made parallel to the introduction direction of the pressure medium, and the one plane 365 is directed to the pressure introduction port 315, and the side plane 366 opposite to the one side plane 365 is directed to the groove portion 323. The one plane 364a is opposite to the terminal 30.

That is, the sensor chip 360 is constructed in a cantilever structure in which one side plane 365 is set free and in which the side plane 66 opposite to the one side plane 365 is fixed to the one end portions 331 of the terminals 330 via the bumps 350. That is, the sensor chip 360 is formed in a so-called vertically arranged structure. In other words, of the one plane 364a in the groove portion 323, a bottom side of the groove portion 323 is bonded to the one side portions 31 of the terminals 330. The one plane 364a and the other plane 364b opposite to the one plane 364a of the sensor chip 360 are separated from the housing 310 because of this arrangement structure of the sensor chip 360. According to this structure, the sensor chip 360 undergoes the effect of the terminals 330 and the case 320 only from the side plane 366 side of the one plane 364a. Moreover, the sensor chip 360 does not undergo the effect of the thermal stress from the housing 310.

Moreover, as shown in FIG. 17, the gage part 363 is arranged on the one plane 365 of the second silicon substrate 361b and the pads 368 are arranged on the side plane 366 side opposite to the one side plane 365. For this reason, the distances between the gage part 363 and the pads 368 become longer than the short sides of the rectangular plate.

The groove portion 323 is formed in a depth to make one side plane 365 side (opening 313 side of the housing 310) of the sensor chip 360 protrude from the tip plane 322 of the case 320. With this, the pressure medium is easily put into contact with the pressure receiving plane and hence the response of the gage part 363 to the pressure can be increased. With this, it is possible to prevent a foreign matter from entering the shallow groove portion 323 and hence to eliminate the effect of the foreign matter at the time of detecting the pressure.

Moreover, the groove portion 323 is filled with a sealing agent 370 for covering the bonding portion of the sensor chip 360 and the bumps 350 and the bonding portion of the bumps 350 and the terminals 330. A fluorine-based resin, for example, is employed as the sealing agent 370. This sealing agent 370 can protect the bonding portions from the pressure medium having high corrosion and hence can enhance corrosion resistance to severe surroundings.

The housing 310 is fitted to the one end portion 321 of the case 320 having the above-mentioned structure. That is, a receiving and depressed portion 316 is formed in the other end portion 314 of the housing 310 and the one end portion 321 of the case 320 is inserted into this receiving and depressed portion 316. Moreover, as shown in FIG. 15, an annular groove (O-ring groove) 328 surrounding the groove portion 323 is formed in the tip plane 322 of the case 320, and an O ring 329 for sealing is disposed in this groove 328. The end portion on the receiving and depressed portion 316 side of the housing 310 is crimped onto the one end portion 321 of the case 320 to form a crimp portion 317, whereby the interior of the housing 310 is sealed and the housing 310 is fitted on the case 320. With this, the pressure medium is introduced from the opening 313 formed in one end portion 311 of the housing 310 to the one end portion 321 of the case 320 through the pressure introduction port 315.

Next, a method for manufacturing the case 320 having the sensor chip 360 and a method for manufacturing the pressure sensor will be described. First, the method for manufacturing the case 320 having the sensor chip 360 will be described with reference to FIGS. 4A to 4C.

First, the sensor chip 360 shown in FIG. 16 and FIG. 17 is manufactured by a semiconductor process, and a part having the bumps 350 formed on the pads 368 is prepared. Moreover, the case 320 having the terminals 330 inserted and molded therein is prepared.

Thereafter, for example, the picture of the tip plane 322 of the case 320 is taken by a camera, and the positions and the like of the one end portions 331 of the terminals 330 in the groove portion 323 are recognized by image processing. The moving of jigs 380, 381 in the process following this is performed on the basis of the positions and the like of the terminals 330 acquired by the image processing.

Figure 18A:
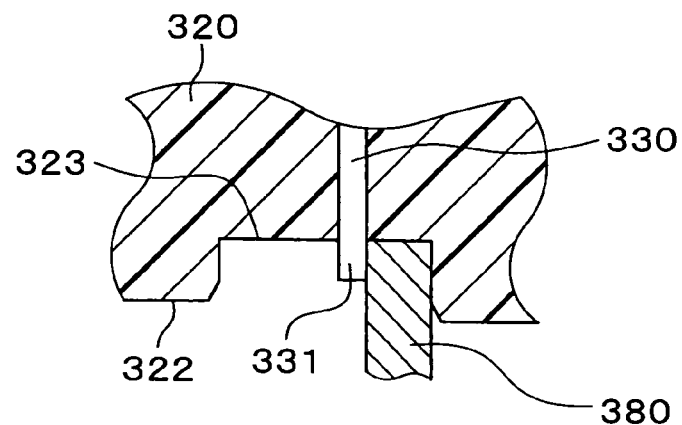
FIGS. 18A, 18B, and 18C are diagrams each showing a manufacturing process for fitting a sensor chip in a case.

Next, in the process shown in FIG. 18A, in the groove portion 323, the jig 380 for supporting the one end portions 331 of the terminals 330 so as to prevent the one end portions 331 of the terminals 330 from being broken is arranged on the opposite side of planes, to which the bumps 350 are to be bonded, of the one end portions 331 of the terminals 330.

Figure 18B:
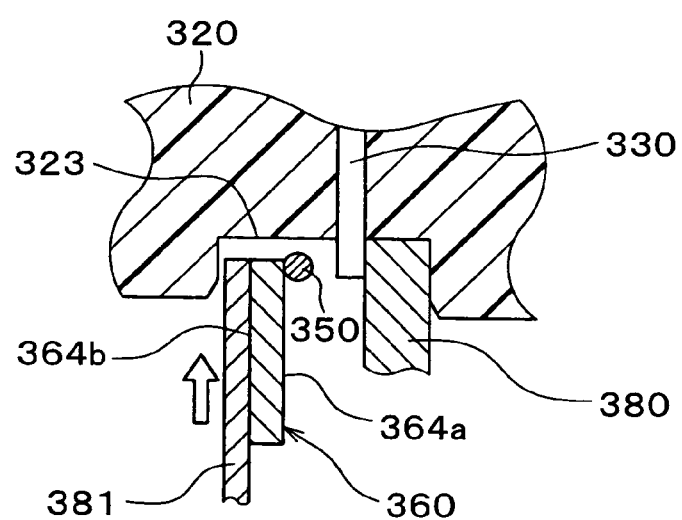

Subsequently, in the process shown in FIG. 18B, the other plane 64b opposite to the one plane 364a of the sensor chip 360 is held by the jig 381. In this case, the sensor chip 360 is held by the jig 381, for example, by a vacuum chucking method. The one plane 364a having the bumps 350 formed thereon is directed to the terminals 330 and the jig 381 is moved in the introduction direction of the pressure medium, whereby the sensor chip 60 is inserted into the groove portion 323. In this case, the case 320 may be moved with the position of the sensor chip 360 fixed and it suffices to move the case 320 and the sensor chip 360 relatively to each other.

Figure 18C:
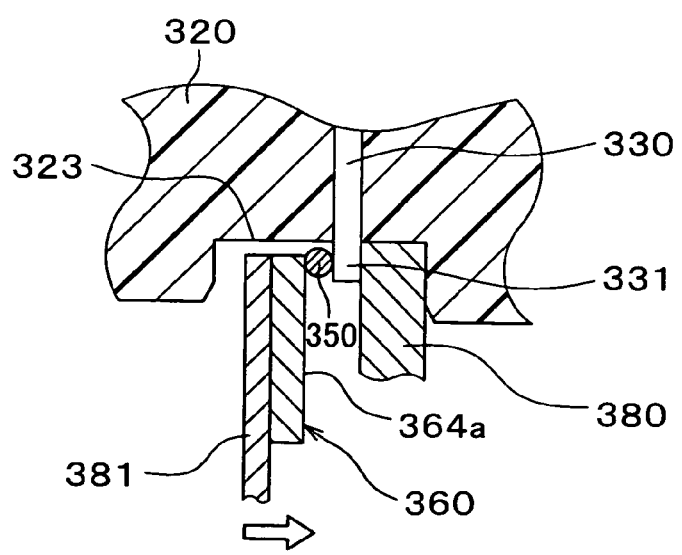

In the process shown in FIG. 18C, the jig 381 is moved in a direction vertical to the introduction direction of the pressure medium to the terminals 330, thereby bringing the bumps 350 into contact with the terminals 330. In this case, the sensor chip 360 is moved to the jig 380 by the jig 381 in such a way that all of the bumps 350 are brought into contact with the one end portions 331 of the respective terminals 330.

Thereafter, the contact portions of the bumps 350 and the terminals 330 are heated, for example, by ultrasonic wave, whereby the bumps 350 and the terminals 330 are bonded to each other by the ultrasonic wave. Then, the groove portion 323 is filled with the sealing agent 370. The circuit board 340 is mounted on the terminals 330 exposed to the groove portion 326 formed on the side portion of the case 320, and the groove portion 326 is covered with a cover 327. Here, the circuit board 340 may be placed in the case 320 before the sensor chip 360 is integrated with the case 320. Specifically, the circuit board 340 may be mounted in the case 320 after the sensor chip 360 is integrated with the case 320. Alternatively, the circuit board 340 may be integrated with the case 320 by a FC (i.e., flip-chip) bonding method. In this manner, the case 320 having the sensor chip 360 mounted thereon is completed.

Next, the method for manufacturing the pressure sensor will be described. The case 320 mounted with the sensor chip 360 in the manner described above is prepared. The O ring 329 is disposed in the groove 328 on the tip plane 322 of the case 320. On the other hand, the housing 310 having the threaded portion 312, the pressure introduction port 315, and the receiving and depressed portion 16 formed thereon is prepared.

Subsequently, the one end portion 321 of the case 320 is fitted in the receiving and depressed portion 316 of the housing 310. Then, the end portion of the housing 310 is crimped onto the one end portion 21 of the case 320 to form the crimp portion 317. In this manner, the housing 310 and the case 320 are integrated with each other, and the housing 310 is fitted on and fixed to the case 320 by the crimp portion 317. In this manner, the pressure sensor shown in FIG. 15 is completed.

The basic action of detecting pressure by the pressure sensor will be described. The pressure sensor is mounted on the engine or the like in the vehicle as described above via the threaded portion 312 of the housing 310. An engine oil is introduced as the pressure medium into the pressure sensor through the pressure introduction port 315 from the opening 313 of the housing 310.

Then, the introduced pressure is applied to the diaphragm of the sensor chip 360. An electric signal responsive to the applied pressure is outputted as a sensor signal from the gage part 63 and is inputted to the circuit of the circuit board 340 via the wiring 367, the pads 368, the bumps 350, and the terminals 330 and the sensor signal is subjected to signal processing.

The sensor signal processed by the circuit of the circuit board 40 is transmitted again to an external circuit via the terminals 330, whereby for example an oil pressure is detected. In this manner, the pressure is detected by the pressure sensor.

Next, the path of the thermal stress in the pressure sensor will be described. In the detection of the pressure as described above, the pressure sensor receives heat from the pressure medium and ambient temperature. The case 320 is made of resin, and the terminals 330 and the bumps 350 are made of metal, and the sensor chip 360 having the gage part 363 formed thereon is made of semiconductor. Thus, the case 320 is the largest in the coefficient of linear expansion, and the metal and the semiconductor are second and third largest in this order.

When the pressure sensor is heated by the pressure medium and the ambient temperature, the case 320 is expanded and the thermal stress caused by thermal expansion is transmitted to the sensor chip 360 via the terminals 330 and the bumps 350. However, in this embodiment, the sensor chip 360 is mounted on the terminals 330 as a cantilever structure, so that the thermal stress is transmitted only to the side plane 366 opposite to the one side plane 65 of the one plane 64a of the sensor chip 360. The thermal stress caused in the case 320 is transmitted to the sensor chip 360 over the path like this.

Here, the gage part 363 is located on one side plane 365 side of the one plane 364a of the sensor chip 360, so that the thermal stress needs to cross the sensor chip 60 in one direction from the side plane 366, opposite to the one side plane 365 of the sensor chip 360 on which the bumps 350 are fitted, to the one side plane 365. In this manner, in the sensor chip 360, the path of the thermal stress to the gage part 363 is one direction, and when the thermal stress transmitted to the bumps 350 is not transmitted from the one end to the other end of the sensor chip 360, the thermal stress does not reach the gage part 363. Thus, this makes it harder for the thermal stress to be transmitted to the gage part 363 and hence the thermal stress transmitted to the gage part 363 is reduced. With this, the gage part 363 can detect only the pressure of the pressure medium without undergoing the effect of the thermal stress.

As described above, this embodiment is characterized in that the sensor chip 360 is constructed in a cantilever structure with respect to the terminals 330 and that the sensor chip 360 is constructed in a vertical arrangement structure in such a way that the pressure receiving plane is parallel to the introduction direction of the pressure medium.

According to this, it is possible to limit the transmission path of the thermal stress caused in the case 320 only to the side plane 366 side of the sensor chip 360 and to make the path of transmitting heat to the gage part 363 one direction. This can make it harder for the thermal stress to be transmitted to the gage part 363, which can prevent the pressure caused by the thermal stress from being detected in the gage part 363. Thus, it is possible to increase the accuracy of detecting the pressure.

Moreover, since the rectangular sensor chip 360 is vertically arranged, the width of the one plane 364a of the sensor chip 360 can be reduced and hence the size in the radial direction of the pressure sensor can be reduced. Thus, it is possible to reduce the size of the pressure sensor.

Thirteenth Embodiment

In this embodiment, only parts different from those in the Twelfth embodiment will be described. In the twelfth embodiment, the sensor chip is connected to the terminals 330 via the bumps 350 fitted on the one plane 64a of the sensor chip 360. However, this embodiment is characterized in that the sensor chip is connected to the one end portions 331 of the terminals 330 via the bumps 350 fitted on the side plane 366 of the sensor chip 360.

Figure 19:
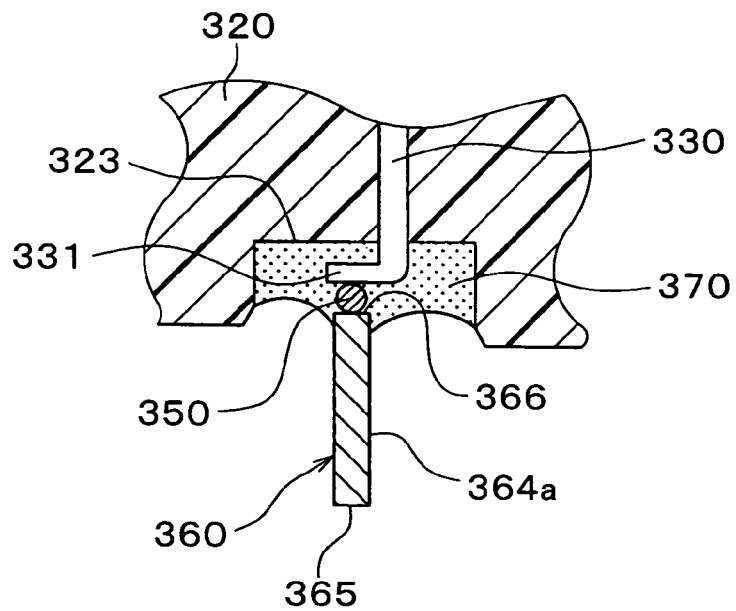
FIG. 19 is a partial sectional view of a pressure sensor according to a thirteenth embodiment of the present disclosure.

FIG. 19 is a partial section view of a pressure sensor according to this embodiment and is an enlarged sectional view of a portion XVI in FIG. 15. As shown in this drawing, the one end portion 331 of the terminal 330 inserted and molded in the case 320 is bent vertically to the introduction direction of the pressure medium.

The construction of the sensor chip 360 is the same as that shown in FIG. 16. However, in this embodiment, the side plane 366, which is opposite to the bottom of the groove portion 323, of the sensor chip 360 is electrically connected to the one end portion 331 of the terminal 330. Specifically, the bump 350 is fitted on the side plane 366 opposite to the one side plane 365 of the sensor chip 360. The bump 350 is bonded to the one end portion 331 of the terminal 330 bent vertically to the introduction direction of the pressure medium and the sensor chip 360 is electrically connected to the terminal 330.

In the bump 350, wiring 367 is extended from the one plane 364a to the side plane 366 of the sensor chip 360 and is formed on a pad 368 disposed on the side plane 366. On the other hand, the wiring 367 may be interposed between the first silicon substrate 361a and the second silicon substrate 361b and may be extended to the side plane 366. In this case, a part in which the bumps 350 are fitted on the side plane 366 of the sensor chip 360 can be obtained by cutting a wafer so as to leave a portion thereof, that is, by performing half cutting of the wafer, at the time of manufacturing the sensor chip 360 and then by fitting the bumps 350 on the side plane of the groove formed by the half cutting and then by dicing the wafer.

The groove portion 323 is filled with the sealing agent 370. With this, the bonding portions of the one end portions 331 of the terminals 330 bent vertically to the introduction direction of the pressure medium and the bumps 350 and the bonding portions of the side plane 366 (pads 368) of the sensor chip 360 and the bumps 350 are covered and protected with the sealing agent 370.

Next, a method for manufacturing the case 320 of the embodiment shown in FIG. 19 will be described with reference to FIG. 20. First, the sensor chip 360 having the bumps 350 fitted on the side plane 66 opposite to the one side plane 365 of the one plane 364a is prepared. Moreover, the terminals 330 are inserted and molded in the case 320 and the one end portions 331 of the terminals 330 in the groove portion 323 are bent vertically to the introduction direction of the pressure medium by the use of the jig.

Subsequently, the picture of the tip plane 322 of the case 320 is taken by the camera and the position and the like of the one end portions 331 of the terminals 330 are recognized by image processing.

Figure 20:
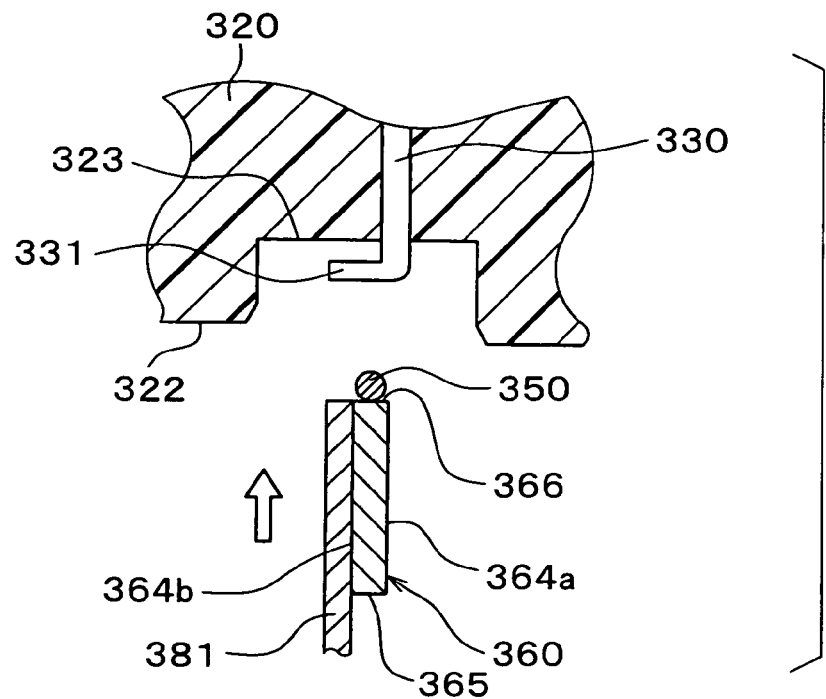
FIG. 20 is a diagram showing a manufacturing process for fitting a sensor chip in a case in the thirteenth embodiment.

Next, as shown in FIG. 20, the other plane 64b opposite to the one plane 64a of the sensor chip 360 is held by the jig 381, and the side plane 366 having the bumps 350 fitted thereon is made opposite to the one end portions 331 of the terminals 330, which are vertically bent. Then, the jig 381 is moved in the introduction direction of the pressure medium to bring the bumps 350 into contact with the terminals 330 to press the bumps 350 onto the one end portions 331 of the terminals 330.

Thereafter, the bumps 350 and the terminals 330 are bonded to each other by the use of ultrasonic wave. In this manner, the case 320 having the sensor chip 360 fitted thereon as shown in FIG. 19 is completed. In the case of manufacturing the pressure sensor, it suffices to fit the case 320 to the housing 310.

As described above, the one end portions 331 of the terminals 330 are bent vertically to the introduction direction of the pressure medium and the bumps 350 are fitted on the side plane 366 of the sensor chip 360, so that it suffices only to move the sensor chip 360 in the introduction direction of the pressure medium. For this reason, it is possible to simplify a fitting process.

Fourteenth Embodiment

In this embodiment, only parts different from those in the twelfth and thirteenth embodiments will be described. In the twelfth and thirteenth embodiments, the groove portion 323 is formed in a depth to make the sensor chip 360 protrude from the tip plane 322 of the case 320. However, this embodiment is characterized in that the groove portion 323 is formed in a depth to receive the whole of the sensor chip 360.

Figure 21:
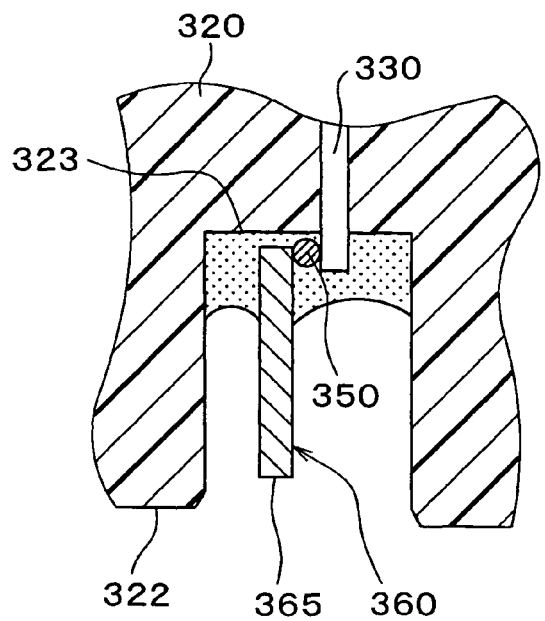
FIG. 21 is a partial sectional view of a pressure sensor according to a fourteenth embodiment of the present disclosure.

FIG. 21 is a partial sectional view of a pressure sensor according to this embodiment and is an enlarged sectional view of the portion XVI in FIG. 15. As shown in this drawing, the one side plane 365 of the sensor chip 360 is located closer to the terminals 330 than the tip plane 322 of the case 320. With this, the whole of the sensor chip 360 is received in the groove portion 323.

In this manner, the sensor chip 360 is arranged in the groove portion 323, so that it is possible to prevent the sensor chip 360 from undergoing the effect of temporary high pressure developed by the pulsation of pressure. Moreover, the sensor chip does not hit on a portion of a manufacturing unit, so that it is possible to make the handling of the pressure sensor easy in the manufacturing process.

Fifteenth Embodiment

In this embodiment, only parts different from those in the twelfth to fourteenth embodiments will be described. This embodiment is characterized in that a bent portion is formed in the one end portion 331 of each of the terminals 330.

Figure 22:
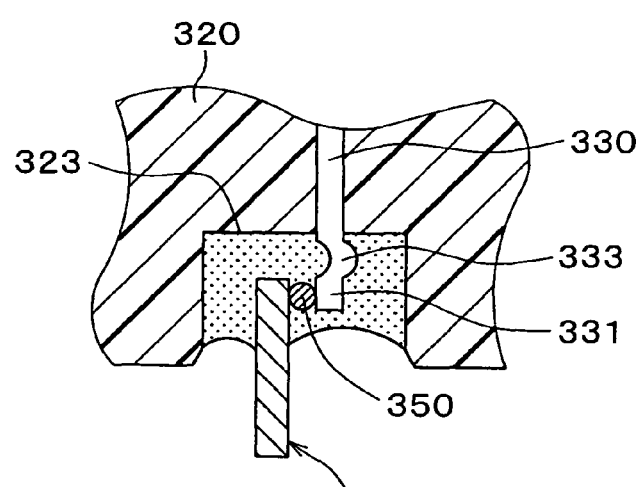
FIG. 22 is a partial sectional view of a pressure sensor according to a fifteenth embodiment of the present disclosure.

FIG. 22 is a partial sectional view of a pressure sensor according to this embodiment and is an enlarged sectional view of the portion XVI in FIG. 15. As shown in this drawing, a bent portion 333 is formed in the one end portion 331 of the terminal 330 exposed to the groove portion 323 by bending a portion of the one end portion 331. The bump 350 is bonded to a portion closer to the end portion of the terminal 330 than the bent portion 333. Here, the number of the bent portions 333 is not limited to one.

This bent portion 333 plays the role of reducing the rigidity of the one end portion 331 of the terminal 330. When the rigidity of the one end portion 331 of the terminal 330 is reduced, the one end portion 331 of the terminal 330 is easily bent by the bent portion 333 in a direction vertical to the introduction direction of the pressure medium.

The bonding of the bumps 350 to the terminals 330 each having the bent portion 33 formed therein is performed in the following manner. First, the case 320 having the terminals 330 inserted and molded therein is prepared. In this case, the terminals 330 each having the bent portion 333 formed therein may be inserted and molded in the case 320, or the bent portions 333 may be formed on the terminals 330 by the use of a jig after inserting and molding the terminals 330 in the case 320.

Then, the sensor chip 360 is moved by the use of the jig 381 to bring the bumps 350 into contact with portions closer to the end portions of the terminals 30 than the bent portions 333, and then the bumps 350 are bonded to the terminals 330 by the use of ultrasonic wave.

At the time of this bonding, if the bent portions 333 are not formed on the one end portions 331 of the terminals 330 and the bumps 350 are bonded to the terminals 30, when the terminals are inserted and molded in the case 320, the accuracy of position of the respective terminals 330 exposed to the groove portion 323 and the accuracy of degree of flatness of the respective planes of the terminals 330 to which the bumps 350 are to be bonded need to be ensured in advance. This is because when the accuracy of degree of flatness of the respective planes of the terminals 330 is bad and the force to press the bumps 350 is weak, some of the bumps 350 might be not bonded to the terminals 30. Conversely, when the bumps 350 are pressed onto the one end portions 331 of the terminals 330 by strong force so as to surely bond all of the bumps 350 to the terminals 330, the force to press the bumps 350 is applied also to the sensor chip 360, which might break the sensor chip 360.

However, like this embodiment, when the bent portion 333 is formed in the one end portion 331 of each of the terminals 330 to make the one end portion 331 easily be bent, even if the sensor chip 360 is moved in a direction vertical to the introduction direction of the pressure medium by the jig 381 to press the bumps 350 by a given force, the one end portions 31 of the terminals 30 are bent to make it possible to absorb the force to press the bumps 350 by the bent portions 333.

According to this, the bumps 350 can be pressed onto the terminals 30 by the force of a certain level of strength and hence all of the bumps 350 can be put into contact with the terminals 330 with reliability. Thus, the bumps 350 can be bonded to the terminals 330 without breaking the sensor chip 360. Further, when the terminals 330 are inserted and molded in the case 320, the flatness of the respective planes to which the bumps 350 are to be bonded in the respective terminals 330 exposed to the groove portion 323 does not need to be ensured, so that the accuracy of position and the accuracy of flatness of the terminals 330 can be also relaxed at the time of inserting and molding the terminals 330.

Here, in the thirteenth embodiment, in the case of employing the bent portion 333 according to this embodiment, it suffices to form the bent portion 333 in any one or both of a portion parallel to the introduction direction of the pressure medium and a portion vertical to the introduction direction of the pressure medium of the one end portion 331 of each of the terminals 330.

Sixteenth Embodiment

In this embodiment, only parts different from those in the twelfth to fifteenth embodiments will be described. This embodiment is characterized in that a cutout is formed in the one end portion 331 of each of the terminals 330.

Figure 23:
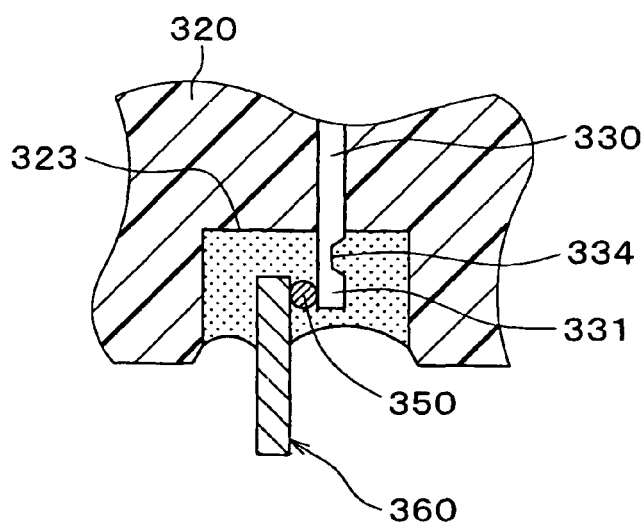
FIG. 23 is a partial sectional view of a pressure sensor according to a sixteenth embodiment of the present disclosure.

FIG. 23 is a partial sectional view of a pressure sensor according to this embodiment and is an enlarged sectional view of the portion XVI in FIG. 15. As shown in this drawing, a cutout 334 is formed in a portion of the one end portion 331 of the terminal 330 exposed to the groove portion 323. The bump 350 is bonded to a portion closer to the end portion of the terminal 330 than the cutout 334. Here, the number of cutouts 334 is not limited to one.

The cutout 334 like this can also provide the one end portion 331 of the terminal 330 with flexibility to a direction vertical to the introduction direction of the pressure medium.

Seventeenth Embodiment

In this embodiment, only parts different from those in the twelfth to sixteenth embodiments will be described. This embodiment is characterized in that a through hole is formed in the one end portion 331 of each of the terminals 30.

Figure 24:
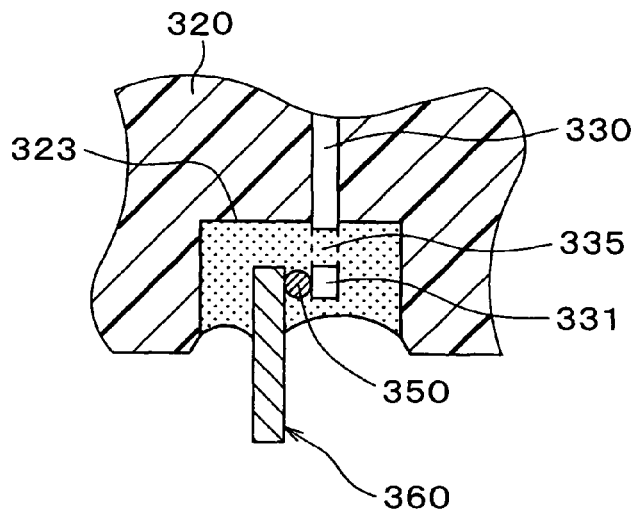
FIG. 24 is a partial sectional view of a pressure sensor according to a seventeenth embodiment of the present disclosure.

FIG. 24 is a partial sectional view of a pressure sensor according to this embodiment and is an enlarged sectional view of the portion XVI in FIG. 15. As shown in this drawing, a through hole 335 is formed in a portion of the one end portion 331 of the terminal 330 exposed to the groove portion 323. The bump 350 is bonded to a portion closer to the end portion of the terminal 330 than the through hole 335. Here, the number of through holes 335 is not limited to one and the size of the hole does not need to be fixed.

The through hole 335 like this can also provide the one end portion 331 of the terminal 330 with flexibility to a direction vertical to the introduction direction of the pressure medium.

Eighteenth Embodiment

In this embodiment, only parts different from those in the twelfth to seventeenth embodiments will be described. This embodiment is characterized in that the one end portion 331 of each of the terminals 330 is bent.

Figure 25:
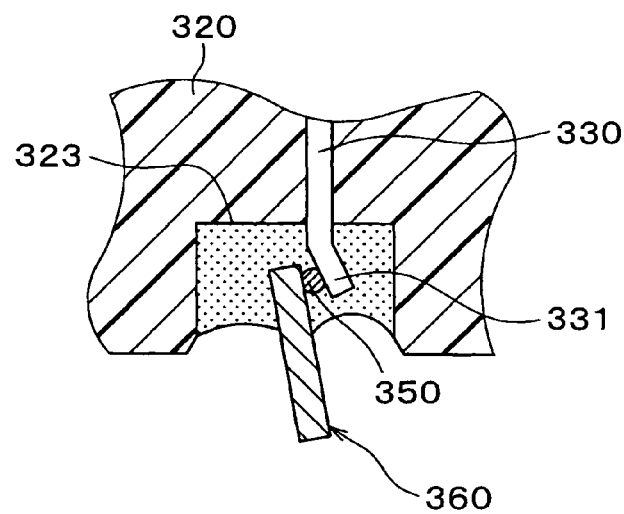
FIG. 25 is a partial sectional view of a pressure sensor according to an eighteenth embodiment of the present disclosure.

FIG. 25 is a partial sectional view of a pressure sensor according to this embodiment and is an enlarged sectional view of the portion XVI in FIG. 15. As shown in this drawing, a plane, to which the bump 350 is to be bonded, of the one end portion 331 of the terminal 330 exposed to the groove portion 323 is bent so as to be located on a plane side opposite to the plane. The bump 350 is bonded to a portion closer to the end portion of the terminal 330 than the bent portion of the one end portion 331.

In other words, a tip portion of the one end portion 331 of the terminal 330 is inclined to the introduction direction of the pressure medium. According to this, at the time of recognizing the position of the one end portion 331 of the terminal 330 by performing image processing to the image taken by the camera, it is possible to enlarge the area of the one end portion 331 the picture of which is taken by the camera. Thus, this can make it easy to recognize the position of a plane to be bonded and hence can make it easy to bond the bumps 350 to the terminals 330.

When the sensor chip 360 is fitted to the terminals 330, the positions of the terminals 330 are checked by the image processing as described above, and then the sensor chip 360 is held by the jig 381 and is inclined by the jig in such a way as to be parallel to the one end portions 331 that are bent. Then, as shown in FIG. 18B and FIG. 18C, the sensor chip 360 is moved in an inclined position and is put into contact with the bent portions of the terminals 330 and then is bonded to the bent portions by the use of ultrasonic wave. In this manner, as shown in FIG. 25, the sensor chip 360 can be fitted to the terminals 330 in the state where the sensor chip 360 is inclined with respect to the introduction direction of the pressure medium.

In this manner, when the one end portion 331 of each of the terminals 330 is bent, the accuracy of position of each of the terminals 330 and the accuracy of flatness of a plane to which the bump 350 is to be bonded can be made lower, and hence the terminals 330 can be easily inserted and molded in the case 320.

Nineteenth Embodiment

In this embodiment, only parts different from those in the twelfth to eighteenth embodiments will be described. This embodiment is characterized in that when the terminals 330 are inserted and molded, the accuracy of position of each of the terminals 330 and the accuracy of flatness of a plane to which the bump 350 is to be bonded can be increased by utilizing the wall surface 323a of the groove portion 323 parallel to the introduction of the pressure medium.

Figure 26:
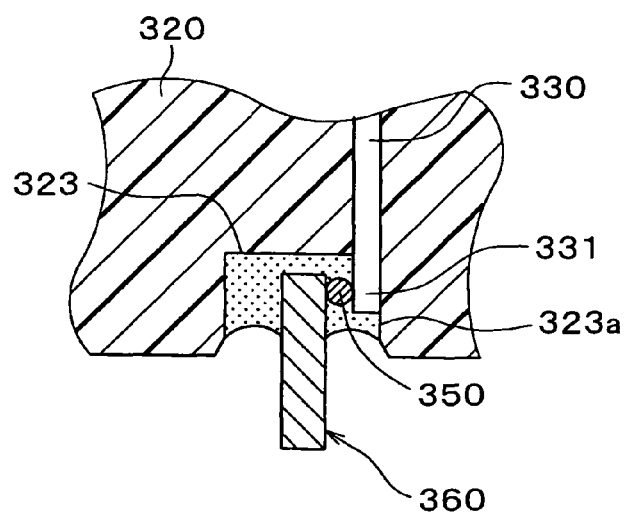
FIG. 26 is a partial sectional view of a pressure sensor according to a nineteenth embodiment of the present disclosure.

FIG. 26 is a partial sectional view of a pressure sensor according to this embodiment and is an enlarged sectional view of the portion XVI in FIG. 15. As shown in this drawing, the one end portion 331 of each of the terminals 330 exposed to the groove portion 323 is inserted and molded in the case 320 so as to be in close contact with the wall surface 323a parallel to the introduction of the pressure medium of the groove portion 323.

Since the terminals 330 are inserted and molded in the case 320 by utilizing the wall surface 323a of the groove portion 323 parallel to the introduction of the pressure medium, the process and the jig for ensuring the accuracy of position and the accuracy of flatness of each of the terminals 330 are not required when the terminals 330 are inserted and molded in the case 320. Moreover, the one end portions 331 of the terminals 330 exposed to the groove portion 323 are arranged along the wall surface 323a of the groove 323, so that the accuracy of position and the accuracy of flatness of each of the terminals 330 are increased. Thus, the terminals 330 can be bonded to the bumps 350 with reliability.

Further, it is possible to reduce variations in the load and stroke of the jig 381 at the time of pressing the sensor chip 360 onto the terminals 330. With this, it is possible to easily manage the load of the jig 381 in the manufacturing unit.

Twentieth Embodiment

In this embodiment, only parts different from those in the twelfth to nineteenth embodiments will be described. In the respective embodiments, the groove portion 323 is filled with only the sealing agent 370. This embodiment is characterized in that a fixing agent 371 and the sealing agent 370 are laminated in the groove portion 323.

Figure 27:
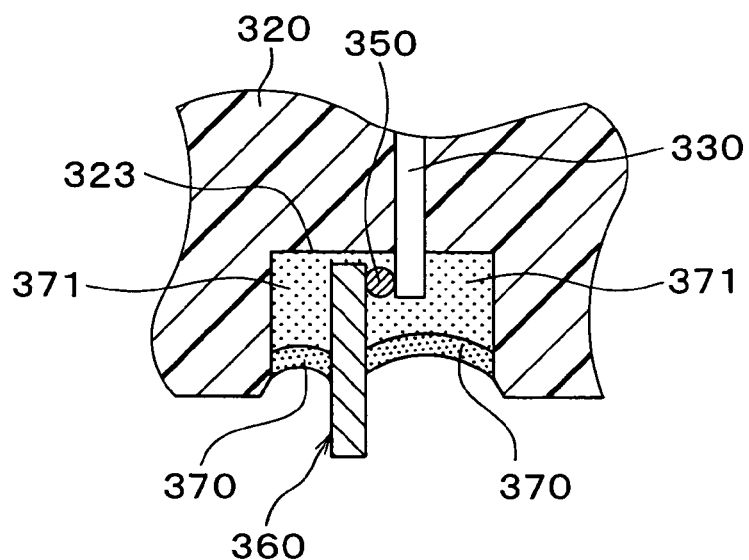
FIG. 27 is a partial sectional view of a pressure sensor according to a twentieth embodiment of the present disclosure.

FIG. 27 is a partial sectional view of a pressure sensor according to this embodiment and is an enlarged sectional view of the portion XVI in FIG. 15. As shown in this drawing, the groove portion 323 is filled with the fixing agent 371 for covering the bonding portions of the sensor chip 360 and the bumps 350 and the bonding portions of the bumps 350 and the terminals 330. The fixing agent 71 strongly fixes the connection of the terminals 330 and the sensor chip 360 and epoxy resin having a high modulus of elasticity is employed as the fixing agent 371.

Further, the sealing agent 370 that is lower in the modulus of elasticity than the fixing agent 371 is placed on the fixing agent 371. The sealing agent 370 protects the above-mentioned bonding portions from the severe surroundings and, for example, fluorine-based resin is employed as the sealing agent 370. In this manner, the above-mentioned bonding portions can be protected by two layers of the fixing agent 371 having a high modulus of elasticity and the sealing agent 371 having a low modulus of elasticity.

Twenty-First Embodiment

The above-mentioned respective embodiments can be combined. For example, in the terminal 330 in which the one end portion 331 of the terminal 330 is bent vertically to the introduction direction of the pressure medium, the bent portion 333 shown in FIG. 22 may be formed on a portion parallel to the introduction direction of the pressure medium of the one end portion 331 and the cutout 334 shown in FIG. 23 may be formed on a portion in a direction vertical to the introduction direction of the pressure medium of the one end portion 331. Moreover, any one of the bent portion 333, the cutout 334, and the through hole 335 according to the fourth to sixth embodiments may be formed in combination on the one end portion 331 of the terminal 330, which is bent, according to the seventh embodiment.

Figure 28:
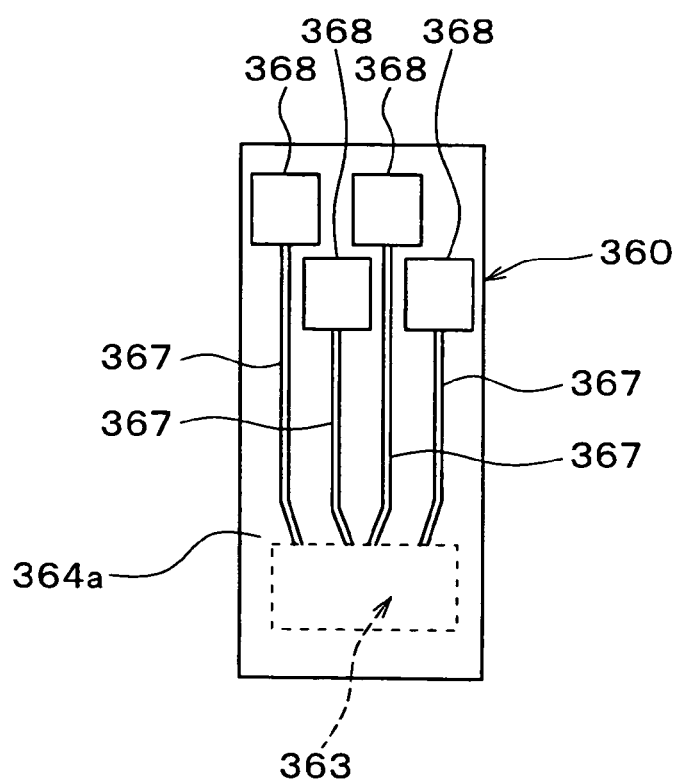
FIG. 28 is a diagram showing the arrangement of pads in a sensor chip in the other embodiment.

The pads 368 are arranged in a line in a direction vertical to the introduction direction of the pressure medium as shown in FIG. 17 in the respective above-mentioned embodiments but may be arranged in the manner as shown in FIG. 28. That is, plural pads 368 arranged in the direction vertical to the introduction direction of the pressure medium are arranged in such a way that the adjacent pads 368 overlap with each other in the introduction direction of the pressure medium. With this, the length in the direction vertical to the introduction direction of the pressure medium in the one plane 364a of the sensor chip 360 can be further reduced than in the case shown in FIG. 17.

The sensor chip 360 formed in the shape of the rectangular plate has been described in the respective embodiments, but the shape of the plate of the sensor chip 360 is not limited to a rectangle but may be a square. It is preferable that the sensor chip 360 is rectangular so as to elongate the distances between the bumps 350 and the gage part 363 and to further reduce the size in the radial direction of the pressure sensor.

The construction of the pressure sensor shown in FIG. 15 is one example, and it is not intended to limit the construction to this example. For example, the sensor signal outputted from the gage part 363 is processed by the processing circuit in the circuit board 340 and the processing circuit in this circuit board 40 can be mounted in the sensor chip 360. In this case, the processing circuit is interposed between the pads 368 and the gage part 363 of the second silicon substrate 361b.

The bumps 350 are used for electrically connecting the one end portions 331 of the terminals 330 and the sensor chip 360 in the respective embodiments. However, the method for electrically connecting them is not limited to the method using the bumps 350 but the other method can be employed. For example, an electric connection method using an electrically conductive paste such as a silver paste can be employed.

The above disclosure has the following aspects.

According to a first aspect, a connector case is characterized by including: a protruding portion that protrudes in an introduction direction of a pressure medium from an tip plane at one end portion of the connector case, has a depressed portion depressed in a direction vertical to the introduction direction of the pressure medium and which protrudes into a pressure introduction port when the connector case is fitted in a housing; a sensor chip that has a gage part for detecting pressure formed on one plane side thereof and is disposed in the depressed portion in such a way that the one plane is parallel to the introduction direction of the pressure medium; a terminal whose one end portion is inserted and molded in and sealed by the connector case; and a bonding wire that electrically connects the sensor chip and the one end portion of the terminal, and is characterized in that a connection portion of the bonding wire and the terminal, a connection portion of the boding wire and the sensor chip, and the bonding wire are sealed by the connector case.

According to this, the width of the sensor chip in a direction vertical to the introduction direction of the pressure medium can be reduced by the arrangement of the sensor chip. With this, the size in a radial direction of the pressure sensor can be reduced and by extension the size of the pressure sensor can be reduced.

Moreover, since the bonding wire is sealed by the connector case, it is possible to prevent the pressure of the pressure medium from being applied directly to the bonding wire. Thus, it is possible to avoid the bonding wire from being broken by the pulsation of the pressure medium and hence to prevent the electric connection of the sensor chip and the terminal from being interrupted.

As described above, it is possible to reduce the size of the pressure sensor and to prevent the electric connection of the sensor chip and the terminal from being interrupted.

In this case, the protruding portion can have a plurality of protruding portions formed on the side plane thereof, the plurality of protruding portions protruding in a direction vertical to the introduction direction of the pressure medium.

With this, it is possible to prevent the protruding portion from being swung in the pressure introduction port and hence to prevent the effect of swing of the protruding portion from being exerted upon the sensor chip.

The housing can have a tapered plane formed on an opening into which the protruding portion is inserted of the pressure introduction port. With this, the protruding portion of the connector case can be easily inserted into the pressure introduction port while sliding on the tapered plane.

The connector case can have a reinforcing terminal that is arranged opposite to the sensor chip and in parallel to the introduction direction of the pressure medium and which is inserted and molded in the connector case.

With this, it is possible to prevent the protruding portion from being deformed in the introduction direction of the pressure medium. In this case, the reinforcing terminal can be arranged so as to be opposite to the sensor chip, whereas the reinforcing terminal can be exposed to the bottom plane of the depressed portion and the sensor chip can be arranged on the reinforcing terminal via an adhesive or the like.

Moreover, the protruding portion can be formed in a length reaching the opening of the housing and can have a thermistor inserted and molded in a tip portion of the protruding portion. The connector case has a terminal for thermistor that is formed in a shape of a bar whose one end portion is connected to a lead wire connected to the thermistor and whose other end portion is inserted and molded so as to be exposed in the opening.

When the protruding portion has the thermistor molded therein, the pressure sensor can be used as a complex sensor. In this case, the protruding portion can have the thermistor molded therein so as to be exposed from the protruding portion.

The terminal for thermistor can be arranged at least opposite to the sensor chip and in parallel to the introduction direction of the pressure medium. With this, it is possible to prevent the protruding portion from being deformed in the introduction direction of the pressure medium.

According to a second aspect, the connector case is characterized by including: a sensor chip that is formed in the shape of a plate, has a gage part for detecting pressure formed on one plane side of the plate, is mounted in such a way that a portion having the gage part formed thereon is exposed from a tip plane of the connector case, and is arranged parallel to an introduction direction of the pressure medium; a terminal whose one end portion is inserted and molded in and sealed by the connector case; and a bonding wire that electrically connects the sensor chip and the one end portion of the terminal, and is characterized in that a connection portion of the bonding wire and the terminal, a connection portion of the boding wire and the sensor chip, and the bonding wire are sealed by the connector case.

With this, the width of the sensor chip in a direction vertical to the introduction direction of the pressure medium can be reduced and hence the size of the pressure sensor can be reduced. Further, since the bonding wire can be sealed in the connector case, it is possible to avoid the bonding wire from being broken and hence to prevent the electric connection of the sensor chip and the terminal from being interrupted.

In this case, it is preferable that a sealing part is interposed in a boundary portion between the tip plane of the connector case and the sensor chip. With this, it is possible to prevent the pressure medium from entering the boundary portion between the sensor chip and the tip plane of the connector case.

According to a third aspect, the connector case is characterized by including: a protruding portion, which protrudes in an introduction direction of a pressure medium from an tip plane at one end portion of the connector case and has a depressed portion depressed in a direction vertical to the introduction direction of the pressure medium and protrudes into a pressure introduction port when the connector is fitted in the housing; a sensor chip that has a gage part for detecting pressure formed on one plane side thereof and is disposed in the depressed portion so as to be parallel to the introduction direction of the pressure medium; and a terminal whose one end portion is inserted and molded in the connector case and is electrically connected to the sensor chip without using a bonding wire and whose other end portion is exposed in an opening formed in the other end portion of the connector case.

With this, the width of the sensor chip in a direction vertical to the introduction direction of the pressure medium can be reduced and hence the size of the pressure sensor can be reduced. Further, since the bonding wire is not used, it is possible to prevent the electric connection of the sensor chip and the terminal from being interrupted.

It is preferable that the sensor chip is formed in the shape of a rectangular plate and that the long sides of the rectangular plate are parallel to the introduction direction of the pressure medium and that the short sides of the rectangular plate are parallel to a direction vertical to the introduction direction of the pressure medium.

With this, the width in a direction vertical to the introduction direction of the pressure medium on a pressure receiving plane on which a gage part of the sensor chip receives pressure can be reduced and hence the size in the radial direction of the pressure sensor can be reduced.

According to a fourth aspect, a connector case is characterized by including: a protruding portion that protrudes in the introduction direction of a pressure medium from a tip plane at one end portion of the connector case and which protrudes into a pressure introduction port when the connector case is fitted in a housing; a first chip that has a gage part for detecting pressure formed on one plane side thereof and which is disposed on a side plane of the protruding portion so as to be parallel to the introduction direction of the pressure medium; a second chip that has a circuit part for processing a signal outputted from the first chip and which is inserted and molded in the connector case in parallel to the introduction direction of the pressure medium; a terminal for internal connection whose one end portion is electrically connected to the first chip and whose other end portion is connected to the second chip via a first bonding wire; and a terminal for external connection whose one end portion is connected to the second chip via a second bonding wire, and is characterized in that the terminal for internal connection, a connection portion of the terminal for internal connection and the first bonding wire, the first bonding wire, a connection portion of the first bonding wire and the second chip, the second chip, a connection portion of the second chip and the second bonding wire, the second bonding wire, a connection portion of the second boding wire and an other end portion of the terminal for external connection are sealed by the connector case.

Even in the case of using the first chip having a gage part formed thereon and the second chip having a circuit part formed thereon, it is possible to reduce the width in the introduction direction of the pressure medium in the respective chips by the arrangement of the respective chips and hence to reduce the size of the pressure sensor. Moreover, since the respective bonding wires are sealed by the connector case, it is possible to prevent the electric connection of the sensor chip and the terminal from being interrupted by a break in the respective bonding wires.

According to a fifth aspect, a pressure sensor includes a housing having a pressure introduction port and a case having its one end portion integrally fitted in the housing and into which a pressure medium is introduced from an opening formed in one end portion of the housing to the one end portion of the case through the pressure introduction port, and is characterized in that the case has: a groove portion depressed in an introduction direction of the pressure medium from a tip plane at the one end portion of the case; a terminal inserted and molded in the case in such a way that its one end portion is exposed to the groove portion; and a sensor chip having one plane parallel to the introduction direction of the pressure medium and having a gage part for detecting pressure that is mounted on a portion, which is close to the opening, of the one plane, wherein the one plane has its portion close to the bottom side of the groove portion electrically connected to the one end portion of the terminal in the groove portion.

According to this, thermal stress transmitted to the sensor chip from the terminal is transmitted only to a portion, which is close to the bottom side of the groove portion, of the one plane of the sensor chip. Moreover, the gate part is located at a portion, which is close to the opening side of the housing, of the one plane of the sensor chip, so that if the thermal stress does not cross the sensor chip in one direction from the bottom side of the groove portion to the opening side, the thermal stress does not reach the gage part. Thus, it is possible to make it harder for the thermal stress to be transmitted to the gage part and hence to reduce the effect of the thermal stress exerted on the gage part. With this, it is possible to increase the accuracy of detecting pressure.

Alternatively, the one plane of the sensor chip and an other plane opposite to the one plane are separated from the housing.

According to this, the sensor chip becomes a cantilever with respect to the terminal. Thus, it is possible to eliminate the transmission of the thermal stress from the other plane of the sensor chip to the gage part and hence to reduce the effect of the thermal stress exerted on the gage part.

Alternatively, the one plane of the sensor chip can be electrically connected to the one end portion of the terminal.

Alternatively a plane, which is opposite to the bottom of the groove portion, of the sensor chip can be electrically connected to the one end portion of the terminal.

In this case, the terminal has one end portion, which is exposed to the groove portion, bent vertically to the introduction direction of the pressure medium, and the plane, which is opposite to the bottom of the groove portion, of the sensor chip can be electrically connected to the one end portion of the terminal that is vertically bent.

Alternatively, the groove portion has a depth to receive the whole sensor chip.

With this, the sensor chip can be protected from pressure pulsation in which pressure is temporarily increased. Thus, the pressure sensor can be used in comparatively high pressure surroundings.

Alternatively, the groove portion has a depth to make a portion, which is close to the opening, of the sensor chip protrude from the tip plane of the case.

With this, it is possible to enhance the responsivity of the gage part to pressure. Moreover, it is possible to prevent a foreign matter from entering the groove portion. With this, it is possible to eliminate the effect of the foreign matter at the time of detecting pressure.

Alternatively, a portion exposed to the groove portion of the terminal can have a bent portion formed thereon, the bent portion being formed by bending a portion of the portion, and the sensor chip can be electrically connected to a portion closer to the end portion of the terminal than the bent portion.

Alternatively, a portion exposed to the groove portion of the terminal can have a cutout formed thereon, and the sensor chip can be electrically connected to a portion closer to the end portion of the terminal than the cutout.

Alternatively, a portion exposed to the groove portion of the terminal can have a through hole formed therein, and the sensor chip can be electrically connected to a portion closer to the end portion of the terminal than the through hole.

Alternatively, in the terminal exposed to the groove portion, a plane, to which the sensor chip is to be bonded, of the one end portion of the terminal can be bent so as to be located on a plane side opposite to the plane, and the sensor chip can be electrically connected to a portion closer to the end portion of the terminal than the bent portion.

Alternatively, the terminal can be inserted and molded in the case in such a way that the one end portion of the terminal exposed to the groove portion is put into close contact with a wall surface, which is parallel to the introduction direction of the pressure medium, of the groove portion.

Alternatively, is characterized in that the groove portion is filled with a sealing agent for covering a bonding portion of the sensor chip and the terminal. With this, it is possible to protect the bonding portion from the pressure medium having high corrosion and hence to enhance resistance to corrosion to severe surroundings.

Alternatively, the groove portion is filled with a fixing agent for covering a bonding portion of the sensor chip and the terminal and has the sealing agent placed on the fixing agent, the sealing agent having a modulus of elasticity lower than the fixing agent. With this, it is possible to surely fix the bonding portion with the fixing agent and to protect the bonding portion from the pressure medium having high corrosion.

Alternatively, the sensor chip is formed in a rectangular shape and in that the sensor chip is arranged in the groove portion in such a way that long sides of the rectangular shape are parallel to the introduction direction of the pressure medium and that short sides of the rectangular shape are parallel to a direction vertical to the introduction direction of the pressure medium.

With this, the sensor chip can have the one plane thereof reduced in a length in a direction vertical to the introduction direction of the pressure medium, and hence the pressure sensor can be further reduced in a size in the radial direction. Moreover, the distance between the bump and the gage part can be made long, so that the transmission of the thermal stress from the bump to the gage part can be further reduced.

Alternatively, the sensor chip has a plurality of pads arranged on a portion, which is close to the groove portion, of the one plane thereof in a direction vertical to the introduction direction of the pressure medium, the plurality of pads having the sensor chip electrically connected thereto, and in that the plurality of pads are arranged in such a way that adjacent pads overlap with each other in the introduction direction of the pressure medium.

With this, the sensor chip can have the one plane thereof reduced in the length in a direction vertical to the introduction direction of the pressure medium, and by extension the pressure sensor can be further reduced in the size in the radial direction.

Alternatively, the one end portion of the terminal can be electrically connected to the sensor chip via a bump.

According to a sixth aspect, a manufacturing method of the pressure sensor is characterized by including the steps of: preparing the case in which the sensor chip and the terminal are inserted and molded; inserting the sensor chip into the groove portion by holding an other plane opposite to the one plane of the sensor chip with a jig and by moving the sensor chip relatively to the case; and electrically connecting the sensor chip to the terminal after inserting the sensor chip into the groove portion.

With this, the sensor chip can be arranged in the groove portion of the case with the one plane of the sensor chip set in parallel to the introduction direction of the pressure medium.

Alternatively, in the step of inserting the sensor chip into the groove portion, the sensor chip is inserted into the groove portion in such a way that the one plane of the sensor chip and the other plane opposite to the one plane are separated from the housing.

With this, it is possible to form a cantilever structure in which only a portion, which is close to the bottom side of the groove portion, of the one plane of the sensor chip is held by the terminal. For this reason, it is possible to prevent thermal stress from being transmitted from the housing to the sensor chip and hence to reduce the effect of the thermal stress exerted on the detection of pressure.

Alternatively, in the step of electrically connecting the sensor chip to the terminal, the one plane of the sensor chip can be electrically connected to the one end portion of the terminal.

Alternatively, in the step of electrically connecting the sensor chip to the terminal, a plane, which is opposite to the bottom of the groove portion, of the sensor chip can be electrically connected to the one end portion of the terminal.

In this case, the terminal can have the one end portion bent vertically to the introduction direction of the pressure medium, the one end portion being exposed to the groove portion, and in the step of electrically connecting the sensor chip to the terminal, the plane, which is opposite to the bottom of the groove portion, of the sensor chip can be electrically connected to the one end portion of the terminal that is vertically bent.

Alternatively, in the step of preparing the case in which the terminal is inserted and molded, a part in which a bent portion is formed in a portion exposed to the groove portion of the terminal by bending a portion of the portion is prepared as the terminal, and in that in the step of electrically connecting the sensor chip to the terminal, the sensor chip is electrically connected to a portion closer to an end portion of the terminal than the bent portion.

With this, the rigidity of the one end portion of the terminal can be reduced, that is, the end portion can be easily bent. In other words, when the sensor chip is strongly pressed onto the one end portion of the terminal, the sensor chip may be broken, whereas when the sensor chip is weakly pressed onto the one end portion of the terminal, the sensor chip may be not bonded to the one end portion. This depends also on the accuracy of position and the accuracy of flatness of the one end portion of the terminal. However, since the one end portion of the terminal can be easily bent, when the sensor chip is moved in the introduction direction of the pressure medium by the jig, even if the sensor chip is pressed by a given force, the one end portion of the terminal can be easily bent. For this reason, the force for pressing the sensor chip is absorbed by the one end portion of the terminal being bent. Thus, it is possible to electrically connect the sensor chip to the one end portion of the terminal without breaking the sensor chip. Moreover, it is also possible to reduce the accuracy of position and the accuracy of flatness required for the terminal at the time of inserting and molding the terminal in the case.

Alternatively, in the step of preparing the case in which the terminal is inserted and molded, a part in which a cutout is formed in a portion exposed to the groove portion of the terminal is prepared as the terminal, and in that in the step of electrically connecting the sensor chip to the terminal, the sensor chip is electrically connected to a portion closer to an end portion of the terminal than the cutout.

It is possible to reduce the accuracy of position and the accuracy of flatness required for the one end portion of the terminal also by the cutout like this.

Alternatively, in the step of preparing the case in which the terminal is inserted and molded, a part in which a through hole is formed in a portion exposed to the groove portion of the terminal is prepared as the terminal, and in that in the step of electrically connecting the sensor chip to the terminal, the sensor chip is electrically connected to a portion closer to the end portion of the terminal than the through hole.

It is possible to reduce the accuracy of position and the accuracy of flatness required for the one end portion of the terminal also by the through hole like this.

Alternatively, in the step of preparing the case in which the terminal is inserted and molded, a part in which a plane, to which the sensor chip is to be bonded, of the one end portion of the terminal is bent so as to be located on a plane side opposite to the plane is prepared as the terminal, and in that in the step of electrically connecting the sensor chip to the terminal, the sensor chip is electrically connected to a portion closer to the end portion of the terminal than the portion that is bent.

It is possible to reduce the accuracy of position and the accuracy of flatness required for the one end portion of the terminal also by bending the one end portion of the terminal in this manner.

Moreover, when the one end portion of the terminal is viewed from the one end portion of the case, the area of the one end portion of the terminal of a plane vertical to the introduction direction of the pressure medium can be enlarged. With this, the position of the one end portion of the terminal can be easily recognized and hence the sensor chip can be easily integrated with the terminal.

In this case, the one end portion of the terminal is inclined to the introduction direction of the pressure medium, so that the sensor chip is integrated with the terminal in the state where the sensor chip is also inclined to the introduction direction of the pressure medium.

Alternatively, in the step of preparing the case in which the terminal is inserted and molded, a part is prepared in which the one end portion of the terminal exposed to the groove portion is put into close contact with a wall surface, which is parallel to the introduction direction of the pressure medium, of the groove portion.

With this, the terminal is arranged along the wall surface parallel to the introduction direction of the pressure medium of the groove portion, so that the accuracy of position and accuracy of flatness of the one end portion of the terminal can be increased when the terminal is inserted and molded in the case.

In the step of electrically connecting the sensor chip to the terminal, one end portion of the terminal is electrically connected to the sensor chip via a bump.

Alternatively, in the step of preparing the case, a part that has the groove portion having a depth to receive the whole sensor chip when the sensor chip is electrically connected to the terminal is prepared as the case.

With this, it is possible to prevent the sensor chip from hitting on a portion of a manufacturing unit and hence to make the handling of the case easy.

Alternatively, in the step of preparing the case, a part that has the groove portion having a depth to make one side plane of the sensor chip protrude from a tip plane of the case when the sensor chip is electrically connected to the terminal is prepared as the case.

Alternatively, in the step of preparing the sensor chip, a rectangular sensor chip is prepared as the sensor chip, and in that in the step of electrically connecting the sensor chip to the terminal, long sides of the rectangular sensor chip are made parallel to the introduction direction of the pressure medium and short sides of the rectangular sensor chip are made parallel to a direction vertical to the introduction direction of the pressure medium.

With this, the sensor chip can have the one plane thereof reduced in the length in a direction vertical to the introduction direction of the pressure medium. Hence, it is possible to manufacture a pressure sensor reduced in the size in the radial direction of the pressure sensor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A pressure sensor comprising:
a housing having a pressure introduction port; and
a connector case integrated with the housing,
wherein the pressure introduction port has a first opening for introducing a pressure medium into the pressure introducing port along with an introduction direction so that the pressure medium reaches the connector case,
wherein the connector case includes:
a protruding portion that protrudes in the pressure introduction port along with the introduction direction from one end of the connector case, and has a concavity hollowed in a direction perpendicular to the introduction direction;
a sensor chip that has a gauge for detecting pressure disposed on one surface of the chip, and is disposed in the concavity so that the one surface of the chip is parallel to the introduction direction;
a terminal having one end, which is inserted and molded in the connector case so that the one end is sealed by the connector case; and
a bonding wire that electrically connects the sensor chip and the one end of the terminal, and
wherein the connector case seals a connection portion between the bonding wire and the terminal, a connection portion between the boding wire and the sensor chip, and the bonding wire.

2. The pressure sensor according to claim 1,
wherein the protruding portion has a plurality of protrusions, each of which is disposed on a side of the protruding portion, and
wherein the plurality of protrusions protrudes along with the direction perpendicular to the introduction direction.

3. The pressure sensor according to claim 1,
wherein the pressure introduction port further has a second opening, in which the protruding portion is inserted,
wherein the second opening of the pressure introduction port has a tapered surface.

4. The pressure sensor according to claim 1,
wherein the connector case further includes a reinforce terminal, which is inserted and molded in the connector case, and
wherein the reinforce terminal faces the sensor chip and is disposed in parallel to the introduction direction.

5. The pressure sensor according to claim 1,
wherein the protruding portion reaches the first opening of the pressure introduction port,
wherein the connector case further includes a thermistor, a thermistor terminal and a connector opening,
wherein the connector opening is disposed opposite to the one end of the connector case,
wherein the thermistor is inserted and molded in a top portion of the protruding portion,
wherein the thermistor terminal has a bar shape, and
wherein one end of the thermistor terminal is coupled with the thermistor via a lead wire, and the thermistor terminal is inserted and molded in the connector case in such a manner that the other end of the thermistor terminal is exposed in the connector opening.

6. The pressure sensor according to claim 5,
wherein the thermistor terminal faces at least the sensor chip, and is in parallel to the introduction direction.

7. A pressure sensor comprising:
a housing having a pressure introduction port; and
a connector case integrated with the housing,
wherein the pressure introduction port has a first opening for introducing a pressure medium into the pressure introducing port along with an introduction direction so that the pressure medium reaches the connector case,
wherein the connector case includes:
a sensor chip that has a gauge for detecting pressure disposed on one surface of the sensor chip, and is disposed in parallel to the introduction direction, the one surface being exposed from one end of the connector case;
a terminal having one end, which is inserted and molded in the connector case so that the one end is sealed by the connector case; and
a bonding wire that electrically connects the sensor chip and the one end of the terminal, and
wherein the connector case seals a connection portion between the bonding wire and the terminal, a connection portion between the boding wire and the sensor chip, and the bonding wire.

8. The pressure sensor according to claim 7,
wherein a boundary between the sensor chip and the one end of the connector case is sealed with a sealing member.

9. A pressure sensor comprising:
a housing having a pressure introduction port; and
a connector case integrated with the housing,
wherein the pressure introduction port has a first opening for introducing a pressure medium into the pressure introducing port along with an introduction direction so that the pressure medium reaches the connector case, and
wherein the connector case includes:
a protruding portion that protrudes in the pressure introduction port along with the introduction direction from one end of the connector case, and has a concavity hollowed in a direction perpendicular to the introduction direction;
a sensor chip that has a gauge for detecting pressure disposed on one surface of the chip, and is disposed in the concavity so that the one surface of the chip is parallel to the introduction direction; and
a terminal having one end, which is inserted and molded in the connector case and electrically connected to the sensor chip directly without using a bonding wire.

10. The pressure sensor according to claim 9,
wherein the sensor chip has a rectangular plate shape with a pair of long sides and a pair of short sides, and
wherein each long side is parallel to the introduction direction, and each short side is perpendicular to the introduction direction.

11. A pressure sensor comprising:
a housing having a pressure introduction port; and
a connector case integrated with the housing,
wherein the pressure introduction port has a first opening for introducing a pressure medium into the pressure introducing port along with an introduction direction so that the pressure medium reaches the connector case,
wherein the connector case includes:
    a protruding portion that protrudes in the pressure introduction port along with the introduction direction from one end of the connector case;
    a first chip that has a gauge for detecting pressure disposed on one surface of the chip, and is disposed on one surface of the protruding portion, which is parallel to the introduction direction;
    a second chip having a circuit for processing a signal output from the first chip, and inserted and molded in the connector case in such a manner that the second chip is parallel to the introduction direction;
    an internal connection terminal having a bar shape and having one end and the other end, the one end electrically connected to the first chip, and the other end connected to the second chip via a first bonding wire; and
    an external connection terminal having a bar shape and having one end connected to the second chip via a second bonding wire, and
wherein the connector case seals the internal connection terminal, a connection portion between the internal connection terminal and the first bonding wire, the first bonding wire, a connection portion between the first boding wire and the second chip, and the second chip, a connection portion between the second chip and the second bonding wire, the second bonding wire, a connection portion between the second bonding wire and the external connection terminal.

12. A pressure sensor comprising:
a housing having a pressure introduction port; and
a case having one end integrated in the housing,
wherein the pressure introduction port has an opening for introducing a pressure medium into the pressure introducing port along with an introduction direction so that the pressure medium reaches the one end of the case,
wherein the case includes:
    a groove disposed on the one end of the case, and hollowed in the introduction direction;
    a terminal inserted and molded in the case, and has one end exposed in the groove; and
    a sensor chip having one surface parallel to the introduction direction, and including a gage for detecting pressure,
wherein the gauge is disposed on the one surface of the sensor chip around one end of the sensor chip,
wherein the one end of the sensor chip is disposed on an opening side,
wherein the sensor chip further includes the other end, which is opposite to the one end, and disposed on a groove side, and
wherein the other end of the sensor chip is electrically coupled with the one end of the terminal.

13. The pressure sensor according to claim 12,
wherein the sensor chip further includes the other surface, which is opposite to the one surface of the sensor chip, and
wherein the one surface and the other surface of the sensor chip are separated apart from the housing.

14. The pressure sensor according to claim 12,
wherein the one surface at the other end of the sensor chip is electrically connected to the one end of the terminal.

15. The pressure sensor according to claim 12,
wherein the sensor chip further includes a bottom surface, which faces a bottom of the groove, and
wherein the bottom surface of the sensor chip is electrically coupled with the one end of the terminal.

16. The pressure sensor according to claim 15,
wherein the one end of the terminal exposed in the groove is bent along with a direction perpendicular to the introduction direction, and
wherein the bottom surface of the sensor chip is electrically coupled with the bent one end of the terminal.

17. The pressure sensor according to claim 12,
wherein the groove has a depth along with the introduction direction, and
wherein the depth of the groove is equal to or larger than a length of the sensor chip so that the sensor chip is accommodated in the groove.

18. The pressure sensor according to claim 12,
wherein the groove has a depth along with the introduction direction, and
wherein the depth of the groove is smaller than a length of the sensor chip so that the one end of the sensor chip protrudes from the groove.

19. The pressure sensor according to claim 12,
wherein the one end of the terminal exposed in the groove has a one-turn bent portion, and
wherein the sensor chip is electrically coupled with a part of the one end of the terminal, the part being disposed on the opening side of the terminal from the one-turn bent portion.

20. The pressure sensor according to claim 12,
wherein the one end of the terminal exposed in the groove has a notch, and
wherein the sensor chip is electrically coupled with a part of the one end of the terminal, the part being disposed on the opening side of the terminal from the notch.

21. The pressure sensor according to claim 12,
wherein the one end of the terminal exposed in the groove has a through hole, and
wherein the sensor chip is electrically coupled with a part of the one end of the terminal, the part being disposed on the opening side of the terminal from the through hole.

22. The pressure sensor according to claim 12,
wherein the one end of the terminal exposed in the groove is bent at a bent portion toward a direction opposite to the sensor chip, and
wherein the sensor chip is electrically coupled with a part of the one end of the terminal, the part being disposed on the opening side of the terminal from the bent portion.

23. The pressure sensor according to claim 12,
wherein the one end of the terminal exposed in the groove contacts a sidewall of the groove, and
wherein the sidewall is parallel to the introduction direction.

24. The pressure sensor according to claim 12, further comprising:
a sealing member disposed in the groove,
wherein the sealing member covers a bonding portion between the sensor chip and the terminal.

25. The pressure sensor according to claim 12, further comprising:
- a fixing member disposed in the groove; and
- a sealing member disposed on the fixing member in the groove,
- wherein the fixing member covers a bonding portion between the sensor chip and the terminal, and
- wherein the sealing member has a modulus of elasticity lower than the fixing member.

26. The pressure sensor according to claim 12,
- wherein the sensor chip has a rectangular shape with a pair of long sides and a pair of short sides,
- wherein each long side is parallel to the introduction direction, and
- wherein each short side is perpendicular to the introduction direction.

27. The pressure sensor according to claim 12,
- wherein the sensor chip has a plurality of pads disposed on the one surface of the sensor chip on the groove side,
- wherein the sensor chip is electrically coupled with the terminal via the plurality of pads, and
- wherein the plurality of pads is alternately arranged along with a direction perpendicular to the introduction direction.

28. The pressure sensor according to claim 12,
- wherein the one end of the terminal is electrically coupled with the sensor chip via a bump.

29. A method for manufacturing a pressure sensor, wherein the pressure sensor includes: a housing having a pressure introduction port; and a case having one end integrated in the housing, wherein the pressure introduction port has an opening for introducing a pressure medium into the pressure introducing port along with an introduction direction so that the pressure medium reaches the one end of the case, wherein the case includes: a groove disposed on the one end of the case, and hollowed in the introduction direction; a terminal inserted and molded in the case, and has one end exposed in the groove; and a sensor chip having one surface parallel to the introduction direction, and including a gage for detecting pressure, wherein the gauge is disposed on the one surface of the sensor chip around one end of the sensor chip, wherein the one end of the sensor chip is disposed on an opening side, wherein the sensor chip further includes the other end, which is opposite to the one end, and disposed on a groove side, and wherein the other end of the sensor chip is electrically coupled with the one end of the terminal, the method comprising:
- preparing the case in which the terminal is inserted and molded;
- inserting the sensor chip into the groove by holding the other surface of the sensor chip opposite to the one surface of the sensor chip with a jig and by displacing the sensor chip relatively to the case; and
- electrically coupling the sensor chip to the terminal after inserting the sensor chip into the groove.

30. The method according to claim 29,
- wherein, in the inserting the sensor chip into the groove, the one surface of the sensor chip and the other surface of the sensor chip are separated apart from the housing.

31. The method according to claim 29,
- wherein, in the coupling the sensor chip to the terminal, the one surface of the sensor chip is electrically coupled with the one end of the terminal.

32. The method according to claim 29,
- wherein, in the coupling the sensor chip to the terminal, a bottom surface of the sensor chip is electrically coupled with the one end of the terminal, and
- wherein the bottom surface of the sensor chip faces a bottom of the groove.

33. The method sensor according to claim 32,
- wherein the one end of the terminal exposed in the groove is bent along with a direction perpendicular to the introduction direction, and
- wherein, in the coupling the sensor chip to the terminal, the bottom surface of the sensor chip is electrically coupled with the bent one end of the terminal.

34. The method according to claim 29,
- wherein, in the preparing the case, the one end of the terminal exposed in the groove has a one-turn bent portion, and
- wherein, in the coupling the sensor chip to the terminal, the sensor chip is electrically coupled with a part of the one end of the terminal, the part being disposed on the opening side of the terminal from the one-turn bent portion.

35. The method according to claim 29,
- wherein, in the preparing the case, the one end of the terminal exposed in the groove has a notch, and
- wherein, in the coupling the sensor chip to the terminal, the sensor chip is electrically coupled with a part of the one end of the terminal, the part being disposed on the opening side of the terminal from the notch.

36. The method according to claim 29,
- wherein, in the preparing the case, the one end of the terminal exposed in the groove has a through hole, and
- wherein, in the coupling the sensor chip to the terminal, the sensor chip is electrically coupled with a part of the one end of the terminal, the part being disposed on the opening side of the terminal from the through hole.

37. The method according to claim 29,
- wherein, in the preparing the case, the one end of the terminal exposed in the groove is bent at a bent portion toward a direction opposite to the sensor chip, and
- wherein, in the coupling the sensor chip to the terminal, the sensor chip is electrically coupled with a part of the one end of the terminal, the part being disposed on the opening side of the terminal from the bent portion.

38. The method according to claim 29,
- wherein, in the preparing the case, the one end of the terminal exposed in the groove contacts a sidewall of the groove, and
- wherein the sidewall is parallel to the introduction direction.

39. The method according to claim 29,
- wherein, in the coupling the sensor chip to the terminal, the one end of the terminal is electrically coupled with the sensor chip via a bump.

40. The method according to claim 29,
- wherein, in the preparing the case, the groove has a depth along with the introduction direction, and
- wherein the depth of the groove is equal to or larger than a length of the sensor chip so that the sensor chip is accommodated in the groove.

41. The method according to claim 29,
wherein, in the preparing the case, the groove has a depth along with the introduction direction, and
wherein the depth of the groove is smaller than a length of the sensor chip so that the one end of the sensor chip protrudes from the groove.

42. The method according to claim 29,
wherein, in the preparing the case, the sensor chip has a rectangular shape with a pair of long sides and a pair of short sides,
wherein, in the coupling the sensor chip to the terminal, each long side is parallel to the introduction direction, and
wherein, in the coupling the sensor chip to the terminal, each short side is perpendicular to the introduction direction.

* * * * *